US012388045B2

(12) United States Patent
Yamauchi et al.

(10) Patent No.: US 12,388,045 B2
(45) Date of Patent: Aug. 12, 2025

(54) BONDING SYSTEM AND BONDING METHOD

(71) Applicant: BONDTECH CO., LTD., Kyoto (JP)

(72) Inventors: Akira Yamauchi, Kyoto (JP); Tadatomo Suga, Tokyo (JP)

(73) Assignees: Tadatomo Suga, Tokyo (JP); BONDTECH CO., LTD., Kyoto (JP)

( * ) Notice: Subject to any disclaimer, the term of this patent is extended or adjusted under 35 U.S.C. 154(b) by 0 days.

(21) Appl. No.: 18/487,068

(22) Filed: Oct. 14, 2023

(65) Prior Publication Data
US 2024/0079373 A1 Mar. 7, 2024

Related U.S. Application Data

(62) Division of application No. 17/269,513, filed as application No. PCT/JP2018/042182 on Nov. 14, 2018.

(30) Foreign Application Priority Data

Aug. 31, 2018 (JP) .................................. 2018-162738
Oct. 31, 2018 (JP) .................................. 2018-205227

(51) Int. Cl.
*H01L 21/683* (2006.01)
*H01L 21/18* (2006.01)
(Continued)

(52) U.S. Cl.
CPC ............ *H01L 24/74* (2013.01); *H01L 21/187* (2013.01); *H01L 21/6838* (2013.01);
(Continued)

(58) Field of Classification Search
CPC ......... H01L 21/187; H01L 2224/80001; H01L 2224/80894–80896; H01L 2224/83894
See application file for complete search history.

(56) References Cited

U.S. PATENT DOCUMENTS 6,180,496 B1 * 1/2001 Farrens ................... H01L 24/26
257/E21.705
6,204,092 B1 3/2001 Freund et al.
(Continued)

FOREIGN PATENT DOCUMENTS

JP    S52-052568 A    4/1977
JP    2003-523627 A   8/2003
(Continued)

OTHER PUBLICATIONS

USPTO, U.S. Final Office Action dated Mar. 6, 2024, issued for the related U.S. Appl. No. 17/269,513, U.S.A., 13 pages.
(Continued)

*Primary Examiner* — David A Zarneke
(74) *Attorney, Agent, or Firm* — ASLAN LAW, P.C.

(57) ABSTRACT

Bonding system for bonding a second article to a first article, comprising an activation treatment device that comprises an object supporter that supports objects comprising the second article, and a particle beam source that activates a bonding surface of the second article by irradiating the objects with a particle beam, the objects being set on one treatment surface without being opposed to each other, followed by performing activation treatment by the particle beam source; and a bond device that brings the second article, of which the bonding surface is activated by the activation treatment device, into contact with the first article, to thereby bond the second article to the first article, wherein the object supporter supports the objects in a posture in which a portion formed of a plurality of kinds of materials comprising the bonding surface of the second article in the objects is exposed to the particle beam source.

19 Claims, 29 Drawing Sheets

(51) Int. Cl.
  *H01L 21/677* (2006.01)
  *H01L 23/00* (2006.01)
(52) U.S. Cl.
  CPC ........ *H01L 24/80* (2013.01); *H01L 21/67721* (2013.01); *H01L 2224/7565* (2013.01); *H01L 2224/75745* (2013.01); *H01L 2224/80001* (2013.01); *H01L 2224/8022* (2013.01); *H01L 2224/80894* (2013.01); *H01L 2224/80895* (2013.01); *H01L 2224/80896* (2013.01); *H01L 2224/83894* (2013.01)

(56) References Cited

U.S. PATENT DOCUMENTS

| | | | | |
|---|---|---|---|---|
| 7,686,912 | B2* | 3/2010 | Suga | H01L 21/187 |
| | | | | 156/272.6 |
| 9,728,519 | B2* | 8/2017 | Kurita | H01L 24/75 |
| 11,114,411 | B2 | 9/2021 | Schwarz et al. | |
| 11,270,897 | B2 | 3/2022 | Hussell et al. | |
| 11,587,804 | B2 | 2/2023 | Yamauchi | |
| 2003/0211705 | A1 | 11/2003 | Tong et al. | |
| 2007/0110917 | A1* | 5/2007 | Okada | H01L 23/544 |
| | | | | 427/532 |
| 2012/0127485 | A1 | 5/2012 | Yamauchi | |
| 2013/0032270 | A1 | 2/2013 | Mawatari | |
| 2015/0048523 | A1 | 2/2015 | Suga et al. | |
| 2016/0126218 | A1* | 5/2016 | Kurita | H01L 24/75 |
| | | | | 156/349 |
| 2017/0047225 | A1 | 2/2017 | Suga et al. | |
| 2018/0130765 | A1 | 5/2018 | Dubey et al. | |
| 2018/0233395 | A1 | 8/2018 | Okita et al. | |
| 2020/0006099 | A1 | 1/2020 | Yamauchi | |

FOREIGN PATENT DOCUMENTS

| | | | |
|---|---|---|---|
| JP | 2008-133497 A | 6/2008 | |
| JP | 2008-302370 A | 12/2008 | |
| JP | 2011-119717 A | 6/2011 | |
| JP | 2012-156473 A | 8/2012 | |
| JP | 2013-243333 A | 12/2013 | |
| JP | 2014-113633 A | 6/2014 | |
| JP | 2015-211130 A | 11/2015 | |
| JP | 2016-092078 A | 5/2016 | |
| JP | 2017-079316 A | 4/2017 | |
| JP | 2018-056507 A | 4/2018 | |
| JP | 2018-133497 A | 8/2018 | |
| WO | WO 2015/163461 A1 | 10/2015 | |
| WO | WO 2018/147147 A1 | 8/2018 | |

OTHER PUBLICATIONS

JP Office Action dated Apr. 16, 2024, issued for the corresponding JP patent application No. 2023-024483, Japan, 6 pages.
U.S. Office Action dated Oct. 26, 2023, issued for the related U.S. Appl. No. 17/269,513, USPTO, Alexandria Virginia USA, Oct. 26, 2023, 18 pages.
Office Action dated Jun. 3, 2024 issued for the corresponding CN patent application No. 201880097003.8, The State Intellectual Property Office of People's Republic of China, People's Republic of China, Jun. 3, 2024, 7 pages.
JPO Office Action dated Aug. 24, 2021, issued for the corresponding JP patent application No. 2020-540018, Examiner Yuichiro Yamaguchi, 5 pages.
Japanese Office Action, issued for the corresponding JP patent application No. 2021-173723, Japan, Jan. 4, 2023, 9 pages.
U.S. Requirement for Restriction/Election, U.S.A., USPTO, U.S. Appl. No. 17/269,513, filed Nov. 22, 2022, 12 pages.
U.S. Non-Final Rejection, U.S.A., USPTO, U.S. Appl. No. 17/269,513, filed Mar. 1, 2023, 8 pages.
U.S. Advisory Action, U.S.A., USPTO, U.S. Appl. No. 17/269,513, filed Sep. 11, 2023, 3 pages.
U.S. Final Office Action issued in U.S. Appl. No. 17/269,513, USPTO, Alexandria, Virginia, USA, Nov. 22, 2024, 21 pages.

* cited by examiner

BONDING SYSTEM AND BONDING METHOD

CROSS-REFERENCE TO RELATED APPLICATIONS

This application is a Divisional of co-pending U.S. application Ser. No. 17/269,513 filed on Feb. 18, 2021, U.S. application Ser. No. 17/269,513 claims priority to JP Patent Application No. 2018-162738 filed on Aug. 31, 2018, to JP Patent Application No. 2018-205227 filed on Oct. 31, 2018, and to PCT Application No. PCT/JP2018/042182 filed on Nov. 14, 2018, the entire contents of which are hereby incorporated by reference.

TECHNICAL FIELD

The present disclosure relates to a bonding system and a bonding method.

BACKGROUND ART

A method, in which bonding surfaces of two articles to be bonded are subjected to plasma treatment, and in which the bonding surfaces of the two articles to be bonded are then brought into contact with each other and bonded to each other, has also been proposed (see, for example, Patent Literature 1). The plasma treatment is performed by exposure to any plasma of oxygen, argon, $NH_3$, and $CF_4$ reactive ion etching (RIE). A method, in which a bonding surface to be bonded to a substrate, of a chip, is subjected to plasma treatment, and in which the bonding surface of the chip is then brought into contact with the substrate to bond the chip to the substrate, has been provided.

CITATION LIST

Patent Literature

Patent Literature 1: Unexamined Japanese Patent Application Publication (Translation of PCT Application) No. 2003-523627.

SUMMARY OF INVENTION

Technical Problem

However, when treatment of exposing a bonding surface of a chip to plasma is performed as described in Patent Literature 1, it is possible that an etched object returns as a particle to the bonding surface due to gravity, or an ionized impurity generated from the bonding surface of the chip collides with the bonding surface again, whereby the impurity including another material is allowed to adhere to the bonding surface, as a result of which bonding strength is deteriorated. In this case, poor bonding between the chip and a substrate may occur.

The present disclosure was made under such circumstances with an objective to provide a bonding system and a bonding method, wherein poor bonding between a first article to be bonded and a second article to be bonded is suppressed.

Solution to Problem

In order to achieve the objective described above, a chip bonding system according to the present disclosure is a bonding system that bonds a second article to be bonded to a first article to be bonded, and includes:

an activation treatment device that includes an object supporter that supports objects including the at least second article to be bonded, and a particle beam source that activates a bonding surface of the second article to be bonded by irradiating the objects with a particle beam, the objects being set on one treatment surface without being opposed to each other, followed by performing activation treatment by the particle beam source; and a bond device that brings the second article to be bonded, of which the bonding surface is activated by the activation treatment device, into contact with the first article to be bonded, to thereby bond the second article to be bonded to the first article to be bonded, wherein the object supporter supports the objects in a posture in which a portion formed of a plurality of kinds of materials including the bonding surface of the second article to be bonded in the objects is exposed to the particle beam source.

A chip bonding method according to another aspect of the present disclosure is a bonding method of bonding a second article to be bonded to a first article to be bonded, and includes:

a first activating step of setting objects including the at least second article to be bonded on one treatment surface without opposing the objects to each other, and of activating a bonding surface of the second article to be bonded by irradiating a portion formed of a plurality of kinds of materials including the bonding surface of the second article to be bonded in the objects with a particle beam; and a bonding step of bringing the second article to be bonded, of which the bonding surface is activated, into contact with the first article to be bonded, to thereby bond the second article to be bonded to the first article to be bonded.

Advantageous Effects of Invention

In accordance with the present disclosure, an object supporter supports objects in a posture in which a portion formed of a plurality of kinds of materials including a bonding surface of a second article to be bonded in the objects is exposed to a particle beam source, and particle beam source activates the bonding surface of the second article to be bonded by irradiating the objects with the particle beam. In other words, the bonding surface of the second article to be bonded is activated by irradiating the portion formed of the plurality of kinds of the materials including the bonding surface of the second article to be bonded in the objects including the at least second article to be bonded, with the particle beam. As a result, an impurity generated from the objects by the irradiation with the particle beam is inhibited from colliding with the bonding surface of the second article to be bonded, adhesion of the impurity including another material to the bonding surface of the second article to be bonded, caused by the collision of the impurities, is suppressed, and the deterioration of bonding strength is suppressed. Accordingly, occurrence of poor bonding between a first article to be bonded and the second article to be bonded is suppressed.

DESCRIPTION OF EMBODIMENTS

A chip bonding system according to an embodiment of the present disclosure will be described below with reference to the drawings. The chip bonding system according to the present embodiment is a system in which a chip is mounted on a substrate. The substrate corresponds to a first article to be bonded, and the chip corresponds to a second article to be bonded. Examples of the chip include a semiconductor chip supplied from a diced substrate. In addition, examples of the chip include: a chip including a bonding surface to be bonded to a substrate, to which only an insulator material is exposed; or a chip including a bonding surface to be bonded to a substrate, to which an insulator material and a conductive material are exposed. Examples of such an insulator material include: an oxide such as $SiO_2$ or $Al_2O_3$; a nitride such as SiN or AlN; an oxynitride such as SiON; or a resin. Examples of such a conductive material include: a semiconductor material such as Si or Ge; or a metal such as Cu, Al, or solder. In other words, the chip may include a bonding surface on which a plurality of kinds of regions of which the materials are different from each other are formed. Specifically, it is also acceptable that the chip includes a bonding surface on which an electrode and an insulator film are disposed, the insulator film being formed of an oxide such as $SiO_2$ or $Al_2O_3$, or a nitride such as SiN or AlN. In the chip bonding system, a mounting surface, on which the chip is mounted, of the substrate, and the bonding surface of the chip are subjected to activation treatment, followed by bringing the chip into contact with the substrate or by pressing the chip against the substrate, to bond the chip and the substrate to each other. The chip and the substrate are then or simultaneously heated to firmly bond the chip to the substrate.

Figure 1:
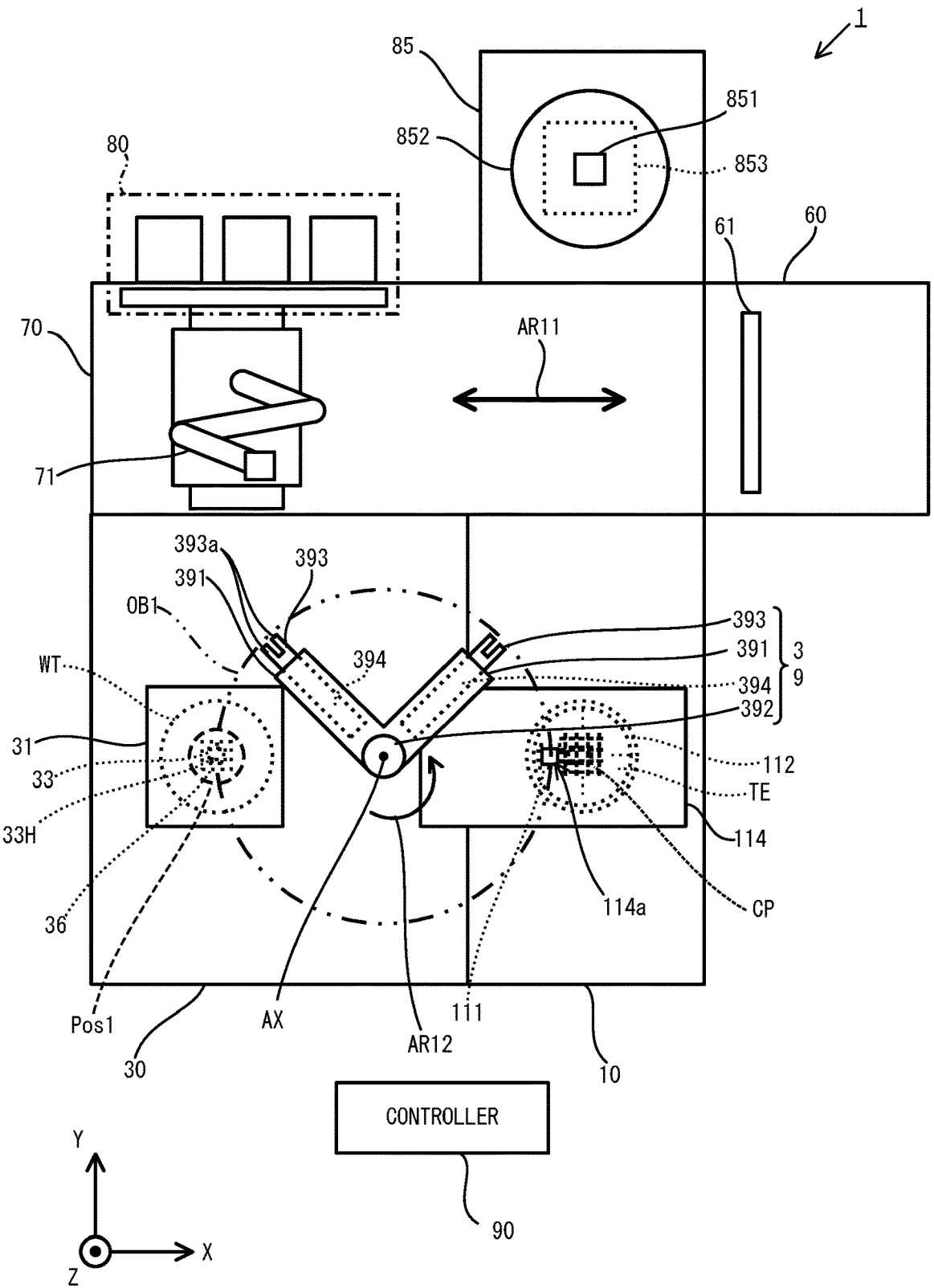
FIG. 1 is a schematic configuration view of a chip bonding system according to an embodiment of the present disclosure.

As illustrated in FIG. 1, a chip bonding system 1 according to the present embodiment includes a chip supply device 10, a chip transportation device 39, a bonding device 30, an activation treatment device 60, a transportation device 70, an export and import unit 80, a cleaning device 85, and a controller 90. The transportation device 70 includes a transportation robot 71 including an arm that grasps a holding frame 112 that holds a substrate WT, or a sheet TE to which a chip CP is stuck. The sheet TE is formed of, for example, a resin. The transportation robot 71 can be moved to a position at which the holding frame 112 that holds the substrate WT, or the sheet TE to which the chip CP is stuck, received from the export and import unit 80 is transferred to each of the activation treatment device 60, the cleaning device 85, the bonding device 30, and the chip supply device 10, as indicated by an arrow AR11 in FIG. 1. The holding frame 112 that holds the sheet TE to which the chip CP is stuck corresponds to an object including the chip CP.

When receiving the substrate WT from the export and import unit 80, the transportation robot 71 moves to a position at which the received substrate WT is transferred to the activation treatment device 60 in a state in which the transportation robot 71 grasps the substrate WT, and transfers the substrate WT to the activation treatment device 60. After completion of activation treatment of a mounting surface WTf of the substrate WT in the activation treatment device 60, the transportation robot 71 receives the substrate WT from the activation treatment device 60, and transfers the received substrate WT to the cleaning device 85. After completion of water cleaning of the substrate WT in the cleaning device 85, the transportation robot 71 further receives the substrate WT from the cleaning device 85, reverses the received substrate WT in a state in which the transportation robot 71 grasps the substrate WT, and then moves to a position at which the substrate WT is transferred to the bonding device 30. The transportation robot 71 transfers the substrate WT to the bonding device 30.

When receiving the holding frame 112 that holds the sheet TE, to which the chip CP is stuck, from the export and import unit 80, the transportation robot 71 moves to a position at which the received holding frame 112 is transferred to the activation treatment device 60 in a state in which the transportation robot 71 grasps the holding frame 112, and transfers the holding frame 112 to the activation treatment device 60. After completion of activation treatment of the bonding surface of the chip CP stuck to the sheet TE in the activation treatment device 60, the transportation robot 71 further receives the holding frame 112 from the activation treatment device 60, and transfers the received holding frame 112 to the chip supply device 10. For example, a high efficiency particulate air (HEPA) filter (not illustrated) is placed in the transportation device 70. As a result, the transportation device 70 contains an atmospheric pressure environment with a very small number of particles.

The cleaning device 85 includes: a stage 852 that supports the substrate WT; a stage driver 853 that rotationally drives the stage 852; and a cleaning head 851 that is placed vertically above the stage 852 and that discharges water toward a section vertically below the stage 852. The cleaning device 85 performs water cleaning of the substrate WT by discharging water from the cleaning head 851 toward the substrate WT while rotating the stage 852 by the stage driver 853 in a state in which the stage 852 is supported by the substrate WT.

Figure 2:
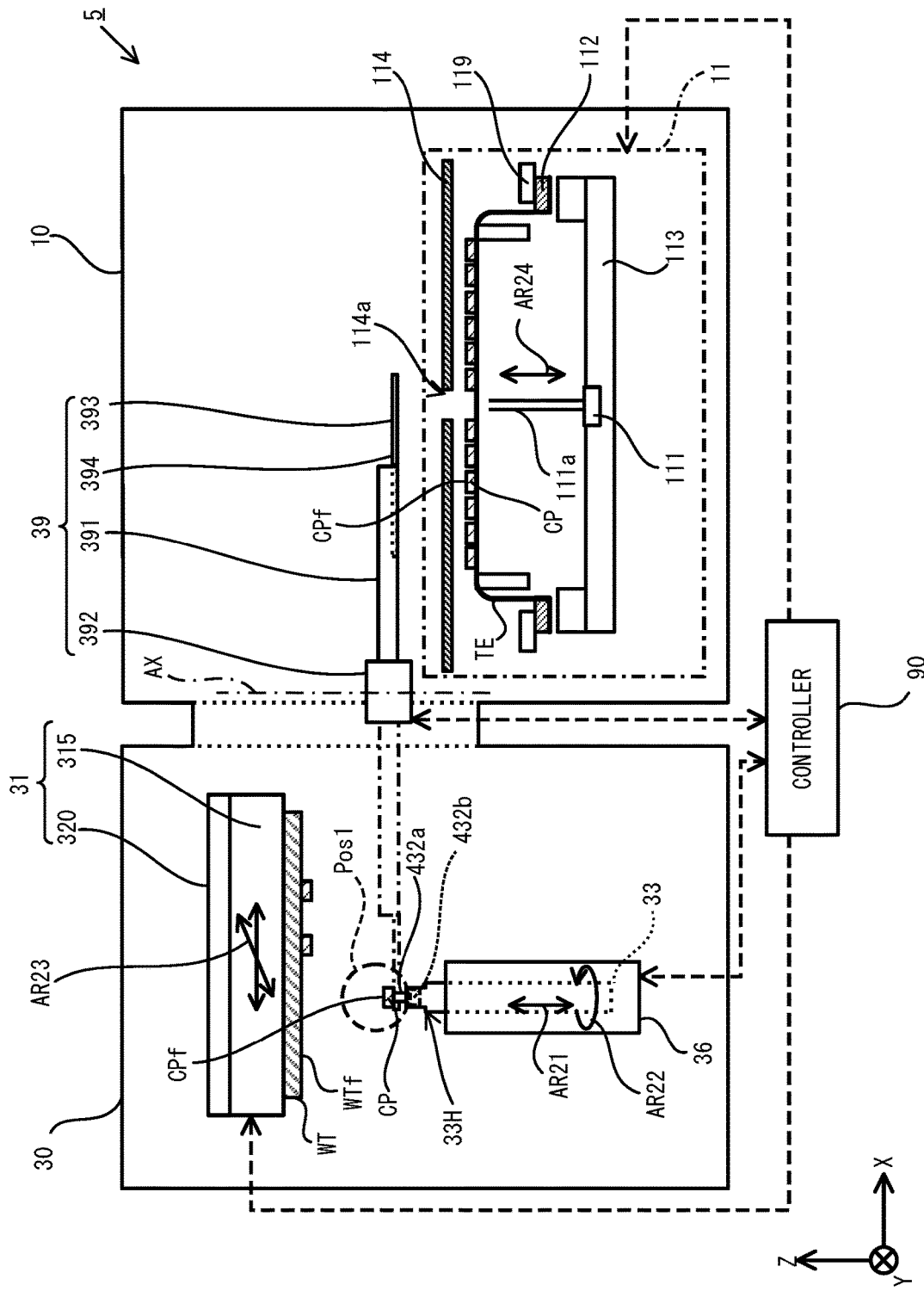
FIG. 2 is a schematic configuration view of a portion of the chip bonding system according to the embodiment, in view from a side of the portion.

The chip supply device 10 is a device for supplying a second article to be bonded that cuts a chip CP from a plurality of chips CP produced by dicing a substrate, and that supplies the chip CP to the bonding device 30. The dicing is treatment of lengthwise and laterally cutting and chipping a substrate implemented with a plurality of electronic components. The chip CP may include, for example, a bonding surface CPf on which a plurality of kinds of regions of which the materials are different from each other are formed. In other words, a region including an insulation material and a region including a metal may be formed on the bonding surface CPf of the chip CP. The chip supply device 10 includes a chip supply 11, as illustrated in FIG. 2. The chip supply 11 includes: the holding frame 112 that holds the sheet TE to which a plurality of chips CP is stuck; a frame holder 119 that holds the holding frame 112; a pick-up mechanism 111 that picks up a chip CP from the plurality of chips CP; and a cover 114. The chip supply 11 includes a holding frame driver 113 that drives the holding frame 112 in the XY direction or in the direction of rotation of the holding frame 112 about the Z-axis. The frame holder 119 holds the frame 112 in a posture in which the surface, to which the plurality of chips CP is stuck, of the sheet TE is in a vertically upper (+Z-direction) side. A sheet holder that holds the sheet TE stuck to a side opposite to the bonding surface CPf of each of the plurality of chips CP in a posture in which the bonding surface CPf faces the vertically upper side includes the holding frame 112 and the frame holder 119.

The pick-up mechanism 111 cuts a chip CP of the plurality of chips CP from the side, opposite to the plurality of chips CP, of the sheet TE, to thereby allow the chip CP in a state in which the chip CP is detached from the sheet TE. The pick-up mechanism 111 holds a circumference which is a third site different from a central portion which is a first site held by a head 33H described later, in a side opposite to the bonding surface CPf of the chip CP, to cut the chip CP. The pick-up mechanism 111 includes a needle 111a, and can move in a vertical direction, as indicated by the arrow AR24 in FIG. 2. The cover 114 is placed to cover a section vertically above the plurality of chips CP, and a hole 114a is opened in a portion, facing the pick-up mechanism 111, of the cover 114. For example, four needles 111a exist. However, the number of needles 111a may be three, or may be five or more. The pick-up mechanism 111 stabs the needle 111a from a section vertically below the sheet TE (in the −Z-direction) into the sheet TE, and lifts the chips CP toward a section vertically above the chips CP (in the +Z-direction), to thereby supply the chips CP. Each chip CP stuck on the sheet TE is pushed out on a one-by-one basis toward a section above the cover 114 through the hole 114a in the cover 114 by the needle 111a, and is transferred to the chip transportation device 39. The holding frame driver 113 changes the positions of the chips CP located in a section vertically below the needle 111a by driving the holding frame 112 in the XY direction or in the direction of rotation of the holding frame 112 about the Z-axis.

The chip transportation device (also referred to as "turret") 39 is a device for transporting a second article to be bonded, that transports the chip CP, supplied from the chip supply 11, to a transfer position Pos1 at which the chip CP is transferred to the head 33H of a bonder 33 of the bonding device 30. As illustrated in FIG. 1, the chip transportation device 39 includes: two long plates 391; arms 394; chip holders 393 disposed on leading ends of the arms 394; and a plate driver 392 that simultaneously rotationally drives the two plates 391. Each of the two plates 391 has a long rectangular box shape, and one end of each of the plates 391 rotates with respect to, as a base point, the other end located between the chip supply 11 and the head 33H. The two plates 391 are placed so that, for example, the longitudinal directions of the plates 391 form an angle of 90 degrees with respect to each other. The number of the plates 391 is not limited to two, but may be three or more.

Figure 3A:
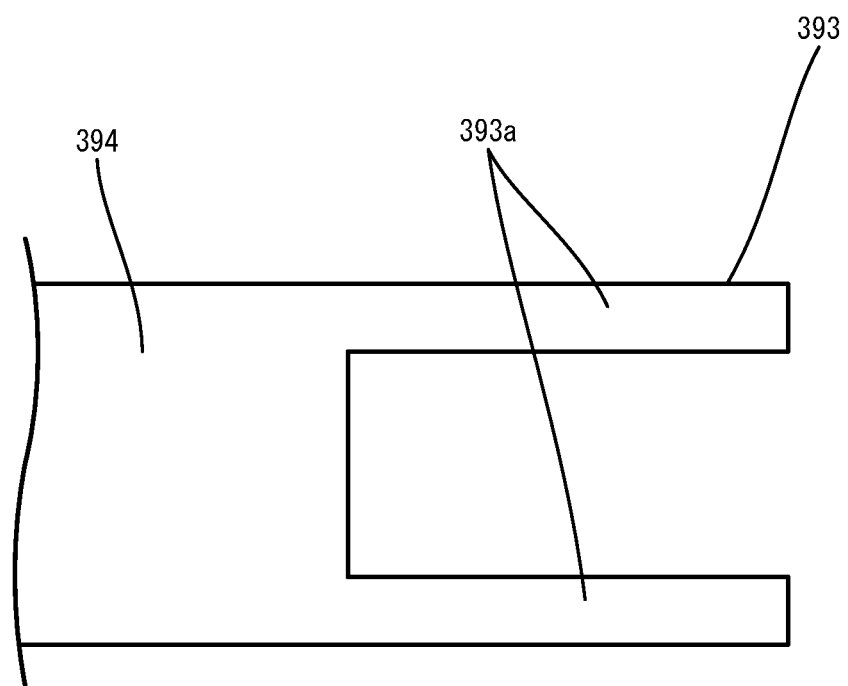
FIG. 3A is a plan view of a chip holder according to the embodiment.
Figure 3B:
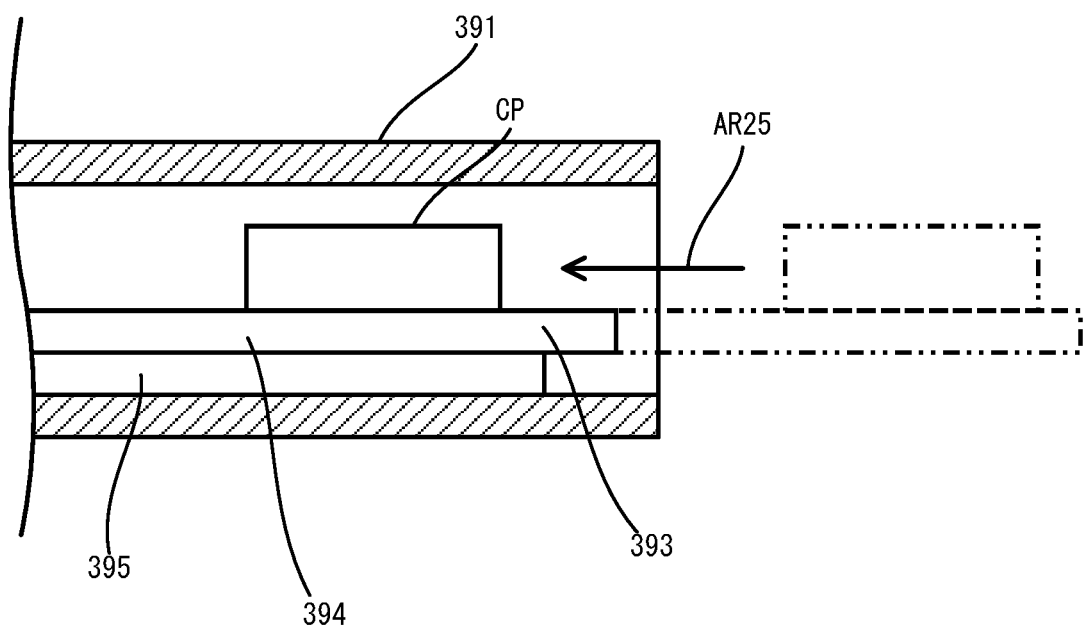
FIG. 3B is a cross-sectional view illustrating a portion of a chip transportation device according to the embodiment.

Each of the chip holders 393 is a holder for a second article to be bonded, that is disposed on the leading end of each of the arms 394, and that includes two leg pieces 393a that hold the chip CP, as illustrated in FIG. 3A. Each of the plates 391 can house each of the long arms 394 in the interior thereof, as illustrated in FIG. 3B. An arm driver 395 that drives each of the arms 394 along the longitudinal direction of each of the plates 391 is disposed in the interior of each of the plates 391. As a result, in the chip transportation device 39, each of the arm drivers 395 enables the leading end of each of the arms 394 to be in the state of protruding to the outside of each of the plates 391, or enables the leading end of each of the arms 394 to be in the state of being deeply inserted into the interior of each of the plates 391. In the chip transportation device 39, when the plates 391 are rotated, the arms 394 are deeply inserted into the plates 391, and the chip holders 393 are received in the interiors of the plates 391, as indicated by the arrow AR25 in FIG. 3B. As a result, particles are inhibited from adhering to the chips CP during transportation. Suction grooves (not illustrated) may be disposed in the two leg pieces 393a. In this case, since the chips CP are held on the leg pieces 392a by suction, the chips CP can be transported without positional deviation. To prevent the chips CP from jumping out due to centrifugal force generated when the plates 391 are rotated, projections (not illustrated) may be disposed on the leading ends of the leg pieces 393a.

As illustrated in FIG. 1, the pick-up mechanism 111 and the head 33H are placed at positions overlapping with the loci OB1 of the leading ends of the arms 394 in the case of rotating the plates 391 in the Z-axis direction. When receiving the chip CP from the pick-up mechanism 111, the chip transportation device 39 transports the chips CP to the transfer position Pos1 overlapping with the head 33H by rotating the plates 391 about an axis AX as indicated by the arrow AR12 in FIG. 1.

Figure 4A:
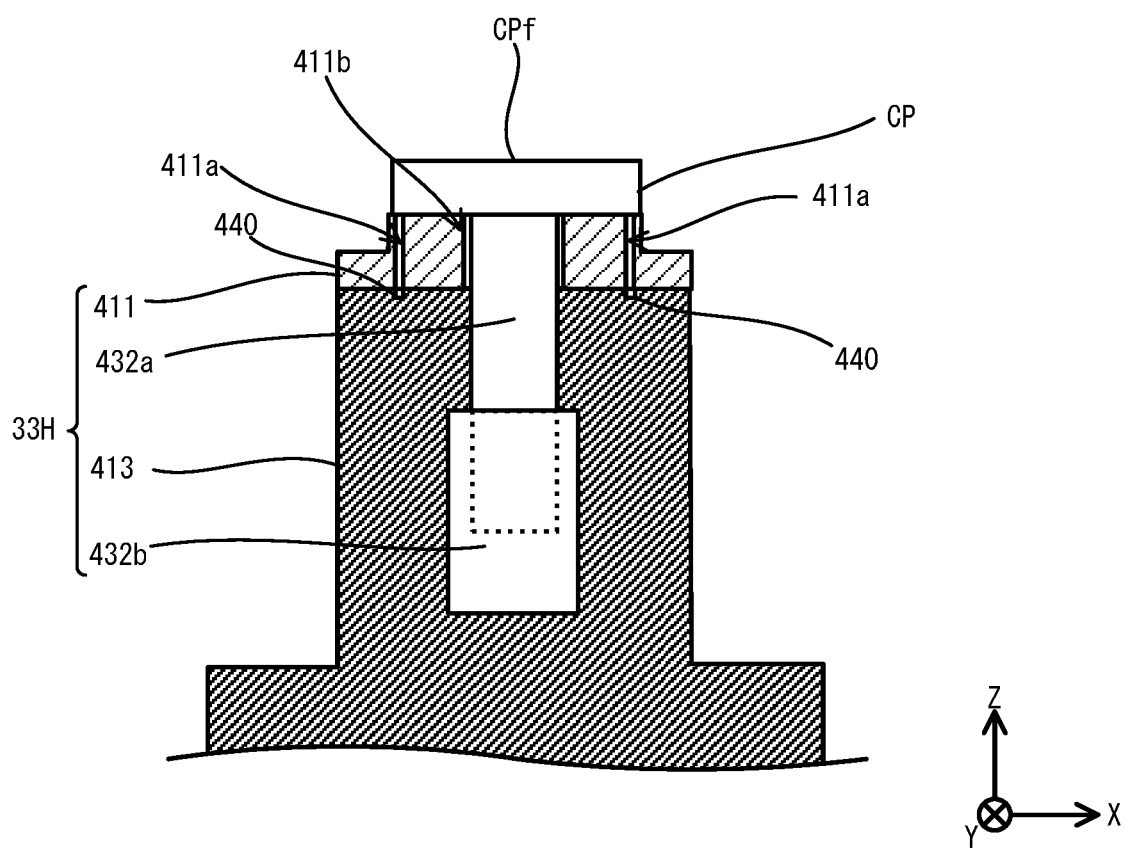
FIG. 4A is a cross-sectional view illustrating a head of a bonding device according to the embodiment.

The bonding device 30 is a chip bond device including: a stage unit 31; the bonder 33 including the head 33H; and a head driver 36 that drives the head 33H. For example, as illustrated in FIG. 4A, the head 33H includes a chip tool 411, a head body 413, a chip supporter 432a, and a supporter driver 432b. The chip tool 411 is formed of, for example, silicon (Si). The head body 413 includes: a holding mechanism 440 including a sucker for allowing the chip tool 411 to hold the chips CP by suction; and a sucker (not illustrated) for fixing the chip tool 411 to the head body 413 by vacuum suction. A ceramic heater, a coil heater, or the like is incorporated into the head body 413. The chip tool 411 includes: a through-hole 411a formed at a position corresponding to the holding mechanism 440 of the head body 413; and a through-hole 411b including the interior into which the chip supporter 432a is inserted.

Figure 4B:
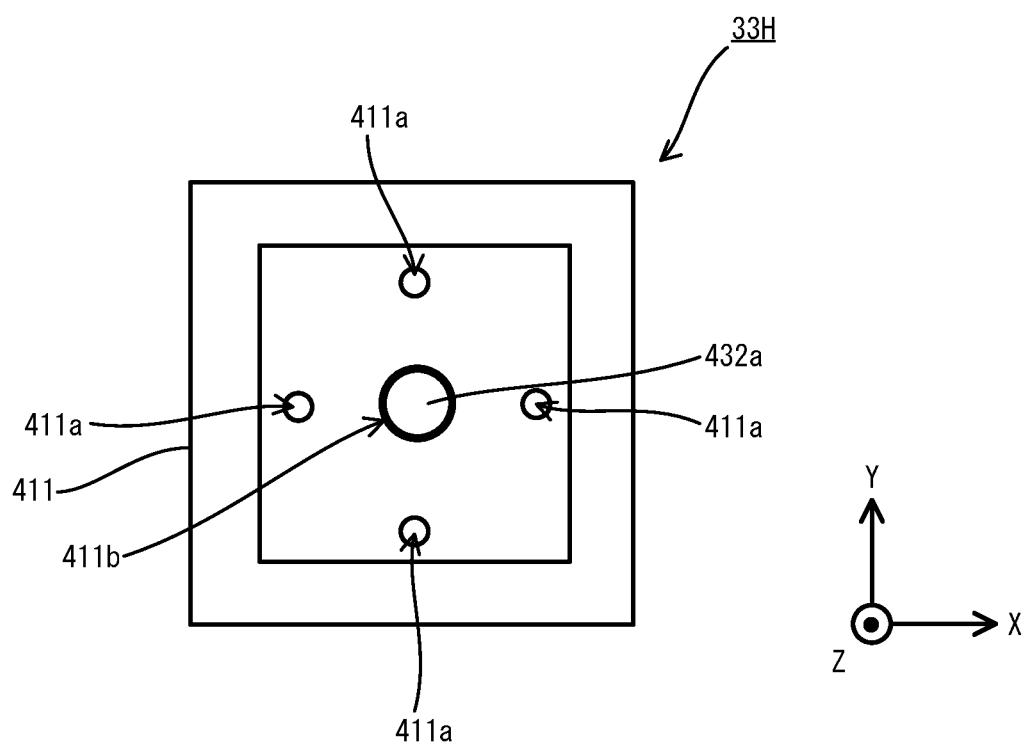
FIG. 4B is a plan view illustrating the head of the bonding device according to the embodiment.

The chip supporter 432a is, for example, a component supporter that is a cylindrical suction post, that is disposed on a leading end of the head 33H, and that is movable in the vertical direction. The chip supporter 432a supports a central portion that is a first site opposite to the bonding surface CPf of the chip CP. For example, as illustrated in FIG. 4B, one chip supporter 432a is disposed at the central portion.

The supporter driver 432b drives the chip supporter 432a in the vertical direction, and allows the chip CP to be sucked on a leading end of the chip supporter 432a by reducing the pressure of the interior of the chip supporter 432a in a state in which the chip CP is placed on the leading end of the chip supporter 432a. The supporter driver 432b is located at the position (see Pos1 in FIG. 1) for transfer to the head 33H in a state in which each of the chip holders 393 of the chip transportation device 39 holds the chip CP, and moves the chip supporter 432a to a section vertically above the chip holder 393 in a state in which the central portion of the chip CP is supported on the leading end of the chip supporter 432a. As a result, the chip CP is transferred from chip holder 393 of the chip transportation device 39 to the head 33H.

The head driver 36 moves the head 33H that holds the chip CP transferred to the transfer position Pos1 (see FIG. 2) to a section vertically above the head 33H (in the +Z-direction), to thereby bringing the head 33H closer to a stage 315, and mounting the chip CP on the mounting surface WTf of the substrate WT. More specifically, the head driver 36 moves the head 33H that holds the chip CP to a section vertically above the head 33H (in the +Z-direction), to thereby bring the head 33H closer to the stage 315 and to bring the chip CP into contact with the mounting surface WTf of the substrate WT to bond the chip CP to the substrate WT. In such a case, the mounting surface WTf of the substrate WT and the bonding surface CPf to be bonded to the substrate WT of the chip CP are subjected to activation treatment by the activation treatment device 60. After the activation treatment of the mounting surface WTf of the substrate WT, water cleaning is performed by the cleaning device 85. Accordingly, so-called hydrophilic bonding between the chip CP and the substrate WT through a hydroxyl group (an OH group) is allowed to occur by bringing the bonding surface CPf of the chip CP into contact with the mounting surface WTf of the substrate WT.

The stage unit 31 includes: the stage 315 that holds the substrate WT in a posture in which the mounting surface WTf, on which the chip CP is mounted, of the substrate WT faces a section vertically below the substrate WT (in the −Z-direction); and a stage driver 320 that drives the stage 315. The stage 315 can move in the X-direction, the Y-direction, and a rotation direction. As a result, the relative positional relationship between the bonder 33 and the stage 315 can be changed, and a position at which each chip CP is mounted on the substrate WT can be adjusted.

Figure 5:
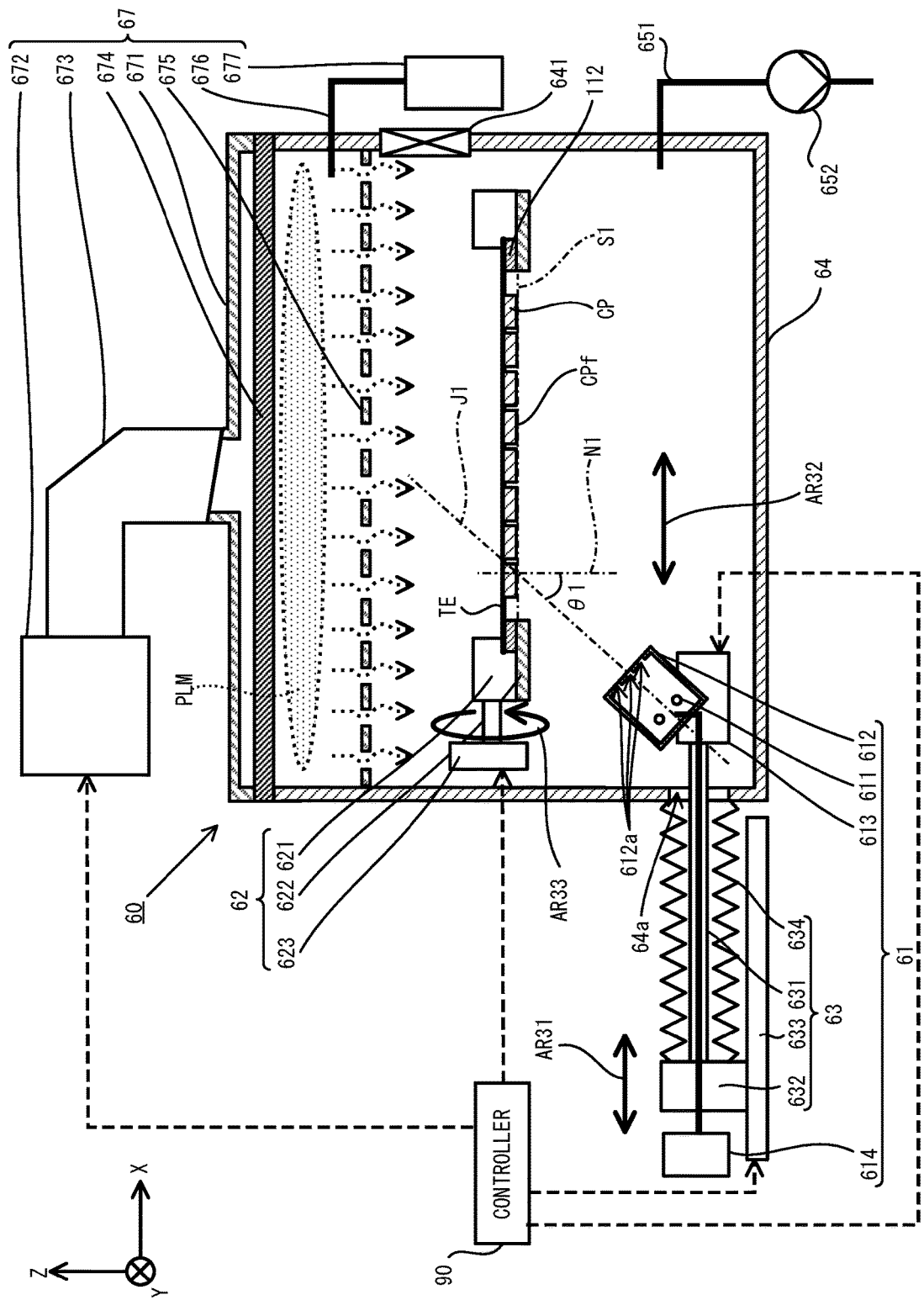
FIG. 5 is a schematic configuration view of an activation treatment device according to the embodiment.

The activation treatment device 60 performs activation treatment of activating the mounting surface WTf of the substrate WT or the bonding surface CPf of the chip CP. The activation treatment device 60 sets such holding frames 112 that hold the substrate WT, or the sheet TE to which the chip CP is stuck, on one treatment surface, without opposing the holding frames 112 to each other, and performs activation treatment. In other words, the activation treatment device 60 does not perform activation treatment in the state of opposing such holding frames 112 that hold two substrates WT, or sheets TE to which two chips CP are stuck, to each other. The treatment in the state of opposing the holding frames 112 to each other causes the material of one substrate WT or chip CP to adhere to the other chip CP or substrate WT, as a result of which a plurality of materials is mixed. As illustrated in FIG. 5, the activation treatment device 60 includes: a chamber 64; a supporter 62 that supports the holding frame 112; a particle beam source 61; a beam source transporter 63; and a radical source 67. The chamber 64 is connected to a vacuum pump 652 through an exhaust pipe 651. When the vacuum pump 652 goes into action, gas in the chamber 64 is exhausted to the outside of the chamber 64 through the exhaust pipe 651, and a reduction in air pressure (pressure reduction) in the chamber 64 occurs.

The supporter 62 includes: a frame holder 621 that has a frame shape and holds the holding frame 112 in the interior of the frame holder 621; a cover 622; and a frame holder driver 623 that supports the frame holder 621 and rotationally drives the frame holder 621 about one axis orthogonal to the thickness direction of the frame holder 621, as indicated by the arrow AR33 in FIG. 5. The supporter 62 corresponds to an object supporter that supports the holding frame 112 that holds the sheet TE to which the chip CP which is an object is stuck. Chip holders that hold chips CP are included. When the substrate WT is put, the supporter 62 supports the substrate WT in a state in which the circumference of the substrate WT is held by the frame holder 621. The supporter 62 supports the holding frames 112 in the state of being set on one treatment surface without opposing the holding frames 112 that hold the sheets TE, to which the chips CP are stuck, to each other. The cover 622 is formed of, for example, glass, and covers the holding frame 112 and the outside region of a portion, to which the chips CP are stuck, in one surface, to which the chips CP are stuck, of the sheet TE, in a state in which the holding frame 112 that holds the sheet TE to which the chips CP are stuck is held by the frame holder 621. When being obtained by dicing a substrate (not illustrated) having a circular shape in planar view, the plurality of chips CP is in the state of being stuck to a region having a circular shape in planar view in the sheet TE. In such a case, a cover having a shape covering a region outside the region having the circular shape in planar view, to which the plurality of chips CP is stuck, in the sheet TE, is adopted as the cover 622. As a result, a portion excluding portions to which the chips CP are stuck in the sheet TE is inhibited from being irradiated with a particle beam by the particle beam source 61.

The particle beam source 61 is, for example, a fast atom beam (FAB) source, and includes: a discharge chamber 612, an electrode 611 placed in the discharge chamber 612, a beam source driver 613, and a gas supply 614 that supplies nitrogen gas into the discharge chamber 612. FAB radiation apertures 612a through which neutral atoms are released are disposed in the surrounding wall of the discharge chamber 612. The discharge chamber 612 is formed of a carbon material. In such a case, the discharge chamber 612 has a long box shape, and the plurality of FAB radiation apertures 612a is adjacently disposed in a straight line along the longitudinal direction of the discharge chamber 612. The beam source driver 613 includes: a plasma generator (not illustrated) that generates the plasma of nitrogen gas in the discharge chamber 612; and a direct-current power source (not illustrated) that applies a direct current voltage to between the electrode 611 and the surrounding wall of the discharge chamber 612. The beam source driver 613 applies a direct current voltage to between the surrounding wall of the discharge chamber 612 and the electrode 611 in the state of generating the plasma of nitrogen gas in the discharge chamber 612. In such a case, nitrogen ions in the plasma are pulled toward the surrounding wall of the discharge chamber 612. In such a case, nitrogen ions pulled toward the FAB radiation apertures 612a receive electrons from the surrounding wall of the discharge chamber 612, formed of the carbon material, of the outer peripheries of the FAB radiation apertures 612a, when passing through the FAB radiation apertures 612a. The nitrogen ions become electrically neutralized nitrogen atoms, which are released to the outside of the discharge chamber 612. However, some of the nitrogen ions fail to receive electrons from the surrounding wall of the discharge chamber 612, and are released as nitrogen ions to the outside of the discharge chamber 612.

Figure 6:
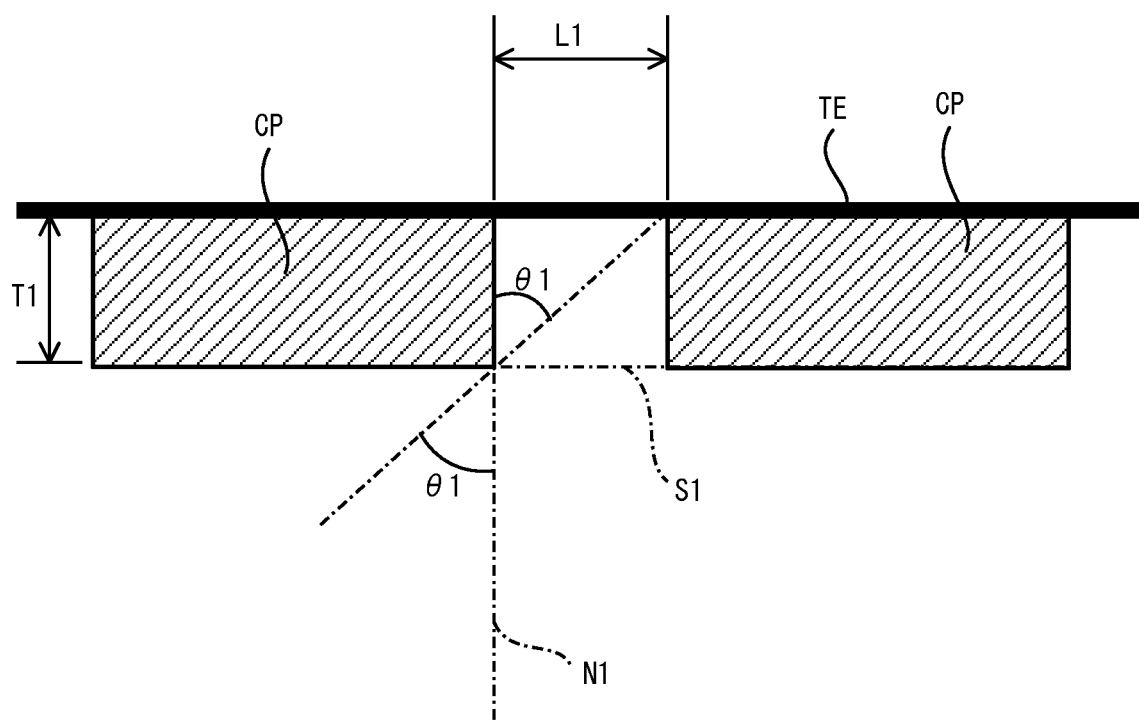
FIG. 6 is an operation explanatory diagram of the activation treatment device according to the embodiment.

In such a case, the particle beam source 61 is set so that the incidence angle of a particle beam with respect to a virtual surface S1 including at least one of each bonding surface CPf of at least one chip CP stuck to the sheet TE is 30 degrees or more and 80 degrees or less. In other words, the angle (incidence angle) θ1 between the illumination axis J1 of the particle beam and the normal direction N1 of the virtual surface S1 is set to be 30 degrees or more and 80 degrees or less. The incidence angle θ1 of the particle beam is set so that the relational equation of the following equation (1) is established when a spacing between chips CP adjacent to each other is set at L1, and the thickness of such a chip CP is set at T1, as illustrated in FIG. 6.

[Equation 1]

$$\theta 1 = \tan^{-1}\left(\frac{L1}{T1}\right) \quad \text{Equation (1)}$$

As a result, the sheet TE is inhibited from being directly irradiated with the particle beam. Accordingly, there is an advantage that since generation of impurities from the sheet TE due to irradiation of the sheet TE with the particle beam is suppressed, damage to the bonding surfaces CPf of the chips CP due to the impurities generated from the sheet TE is suppressed.

The beam source transporter 63 includes: a support rod 631 that is long, that is inserted into a hole 64a disposed in the chamber 64, and that supports the particle beam source 61 on one end of the support rod 631; a support 632 that supports the support rod 631 on the other end of the support rod 631; and a support driver 633 that drives the support 632. The beam source transporter 63 includes a bellows 634 interposed between the support 632 and the outer periphery of the hole 64a of the chamber 64 to maintain the vacuum degree in the chamber 64. The support driver 633 drives the support 632 in the direction in which the support rod 631 is inserted into and removed from the chamber 64 as indicated by the arrow AR31 in FIG. 5, to thereby change the position of the particle beam source 61 in the chamber 64 as indicated by the arrow AR32 in FIG. 5. In such a case, the beam source transporter 63 moves the particle beam source 61 to the direction orthogonal to the direction of the alignment of the plurality of FAB radiation apertures 612a.

The particle beam source 61 includes the plurality of FAB radiation apertures 612a adjacently disposed in the straight line as described above. The particle beam source 61 is moved in the direction orthogonal to the direction of the alignment of the plurality of FAB radiation apertures 612a. As a result, the shape of the region irradiated with the particle beam becomes rectangular. In contrast, the plurality of chips CP is in the state of being stuck to the region having the circular shape in planar view in the sheet TE when being obtained by dicing a substrate (not illustrated) having a circular shape in planar view. Accordingly, for irradiating the whole plural chips CP stuck to the sheet TE with a particle beam, it is necessary to set a region irradiated with the particle beam to a rectangular region including a region having a circular shape in planar view to which the plural chips CP are stuck. In this case, in a configuration in which the cover 622 described above is absent, the holding frame 112 or the region outside the plurality of chips CP in the sheet TE is irradiated with the particle beam, and impurities are prone to be generated from the sheet TE. In contrast, in the present embodiment, the cover 622 covers the holding frame 112 or the region outside the plurality of chips CP in the sheet TE. As a result, the particle beam with which the holding frame 112 or the region outside the plurality of chips CP in the sheet TE is irradiated is intercepted, and impurities are inhibited from being generated from the sheet TE or the holding frame 112.

An inductively coupled plasma (ICP) plasma source including a plasma chamber 671, a glass window 674, a trap plate 675, a waveguide 673, and a magnetron 672 may be adopted as the radical source 67. The plasma chamber 671 is connected to the waveguide 673 through the glass window 674. The radical source 67 includes a gas supply 677 that supplies nitrogen gas into the plasma chamber 671 through a supply pipe 676. A microwave generated by the magnetron 672 is introduced into the plasma chamber 671 through the waveguide 673. For example, a magnetron that generates a microwave with a frequency of 2.45 GHz can be adopted as the magnetron 672. In such a case, an electric power supplied from the magnetron 672 to the plasma chamber 671 is set at, for example, 2.5 kW. When a microwave is introduced from the waveguide 673 in a state in which nitrogen gas is introduced into the plasma chamber 671, plasma PLM is formed in the plasma chamber 671 by the microwave. The trap plate 675 traps ions included in the plasma PLM to result in downflow of only radicals into the chamber 64. In other words, the plasma is generated in the plasma chamber 671, and the downflow of only the radicals, included in the plasma, to a lower section of the plasma chamber 671 occurs.

The radical source 67 is not limited to the configuration including the magnetron 672 and the waveguide 673, but may have, for example, a configuration including a plate electrode disposed on the glass window 674 and a high-frequency power source that is electrically connected to the plate electrode. In such a case, for example, a high-frequency power source that applies a high-frequency bias of 27 MHz can be adopted as the high-frequency power source. An electric power supplied from the high-frequency power source to the plasma chamber 671 is set at, for example, 250 W. In irradiation with the particle beam, vacuum drawing is performed using, for example, a turbo molecular pump to allow the pressure in the chamber 64 to be on the order of $10^{-3}$ Pa. In radical treatment, however, the vacuum drawing is performed to increase the pressure in the chamber 64 to approximately several tens of Pa.

Figure 7:
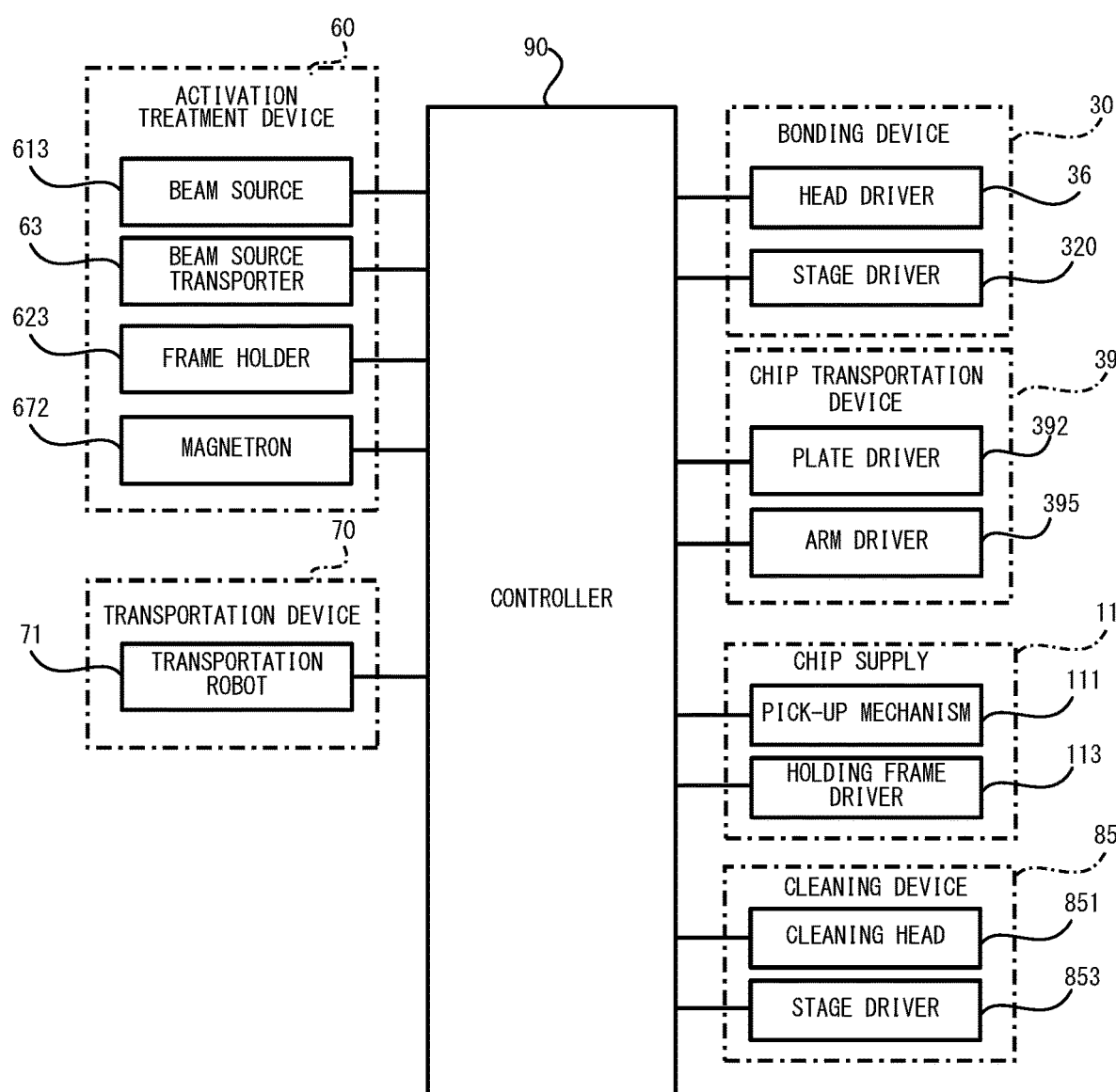
FIG. 7 is a block diagram illustrating a controller according to the embodiment.

The controller 90 includes a micro processing unit (MPU), a main storage, an auxiliary storage, an interface, and a bus that connects each component. In such a case, the main storage includes a volatile memory, and is used as the work area of the MPU. The auxiliary storage includes a nonvolatile memory, and stores a program that is executed by the MPU. The auxiliary storage also stores information indicating first and second distances described below. The controller 90 is connected to the head driver 36, the stage driver 320, the plate driver 392, the arm driver 395, the pick-up mechanism 111, the holding frame driver 113, a cleaning head 851, a stage driver 853, the beam source driver 613, the beam source transporter 63, the frame holder driver 623, the magnetron 672, and the transportation robot 71, as illustrated in FIG. 7. The MPU allows the program stored in the auxiliary storage to be read in the main storage, and executes the program, to thereby output a control signal to each of the head driver 36, the stage driver 320, the plate driver 392, the arm driver 395, the pick-up mechanism 111, the holding frame driver 113, the cleaning head 851, the stage driver 853, the beam source driver 613, the beam source transporter 63, the frame holder driver 623, the magnetron 672, and the transportation robot 71 through the interface.

Figure 8:
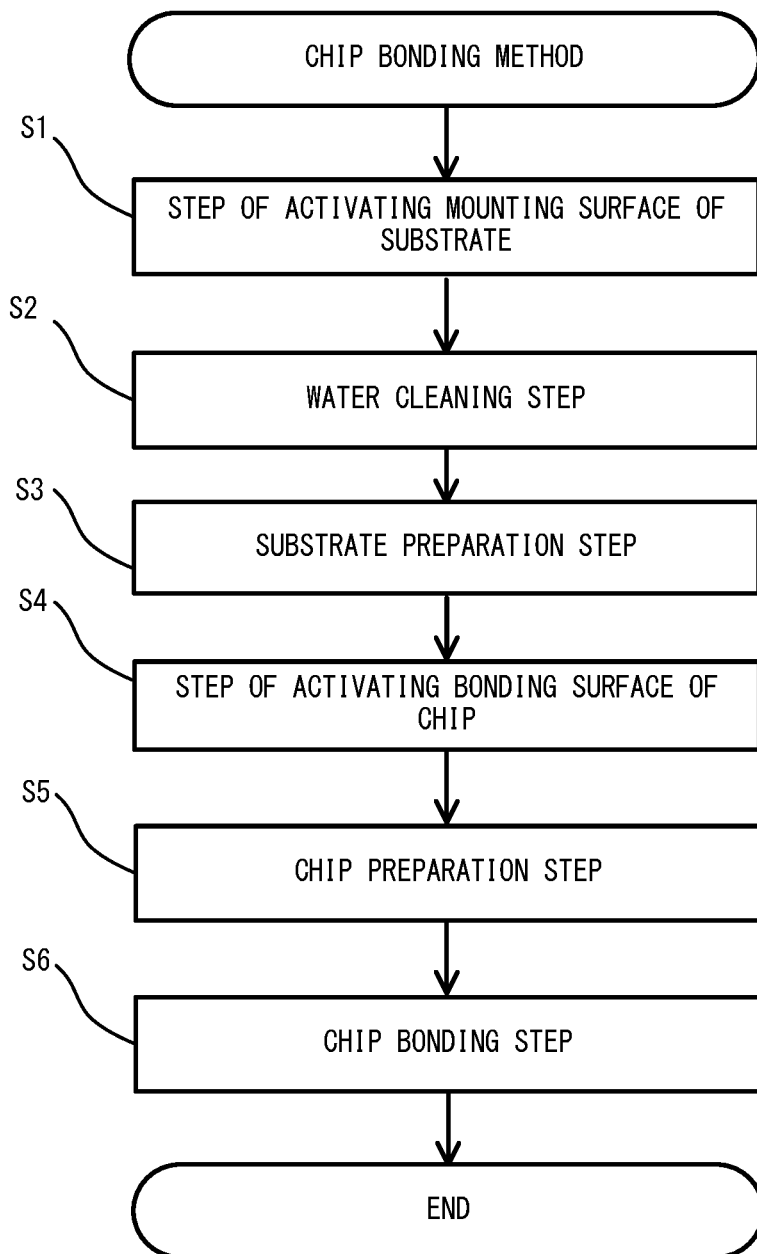
FIG. 8 is a flow chart illustrating an example of the flow of a chip bonding method according to the embodiment.

Operation of the chip bonding system 1 according to the present embodiment will now be described with reference to FIGS. 8 to 12. The holding frame 112 that holds the substrate WT and the sheet TE to which the chips CP are stuck is put from the export and import unit 80. First, the chip bonding system 1 puts the substrate WT, put from the export and import unit 80, into the activation treatment device 60, to thereby execute a step of activating a mounting surface of a substrate, in which the mounting surface WTf of the substrate WT is subjected to activation treatment, as illustrated in FIG. 8 (step S1). First, the activation treatment device 60 allows the mounting surface WTf to be irradiated with the particle beam including nitrogen atoms from the particle beam source 61 in a state in which support by the supporter 62 is performed in a posture in which the mounting surface WTf of the substrate WT faces vertically downward. In such a case, a power supplied to the particle beam source 61 is set at, for example, 1 kV, 100 mA. The flow rate of nitrogen gas introduced into the discharge chamber 612 of the particle beam source 61 is set at, for example, 100 sccm. The particle beam source 61 is reciprocated once at a rate of 1.2 to 14.0 mm/sec while irradiating the mounting surface WTf of the substrate WT with a particle beam from the particle beam source 61. Then, the activation treatment device 60 reverses the substrate WT held by the frame holder 621, to thereby allow the substrate WT in a posture in which the mounting surface WTf of the substrate WT faces vertically upward.

The activation treatment device 60 allows the radical source 67 to irradiate the mounting surface WTf of the substrate WT with nitrogen radicals. In such a case, an electric power supplied from the magnetron 672 to the plasma chamber 671 in the radical source 67 is set at, for example, 2.5 kW. When the radical source 67 has the above-mentioned configuration including the plate electrode disposed on the glass window 674 and the high-frequency power source that is electrically connected to the plate electrode, an electric power supplied from the high-frequency power source to the plasma chamber 671 is set at, for example, 250 W. The flow rate of nitrogen gas introduced into the plasma chamber 671 is set at, for example, 100 sccm. Further, a time period in which the irradiation of the mounting surface WTf of the substrate WT with the radicals is continued is set at, for example, 15 sec. For example, when metal electrodes and insulator films are disposed on both of the mounting surface WTf of the substrate WT and the bonding surface CPf of the chip CP, it is preferable to irradiate the mounting surface WTf of the substrate WT with a particle beam.

Then, the chip bonding system 1 puts the substrate WT subjected to activation treatment from the activation treatment device 60 into the cleaning device 85, to execute a water cleaning step of performing water cleaning of the mounting surface WTf of the substrate WT (step S2). The cleaning device 85 performs the water cleaning of the substrate WT by discharging water from the cleaning head 851 toward the substrate WT while allowing the stage driver 853 to rotate a stage 852 in a state in which the substrate WT is supported on the stage 852. As a result, a state in which a relatively large amount of hydroxyl groups (OH groups) or water molecules adhere to the mounting surface WTf of the substrate WT is achieved.

Subsequently, the chip bonding system 1 executes a substrate preparation step in which the substrate WT is allowed to be held on the stage 315 of the bonding device 30 to perform preparation for bonding the chip CP to the substrate WT (step S3). In such a case, the transportation robot 71 receives the substrate WT from the cleaning device 85 in a posture in which the mounting surface WTf of the substrate WT faces vertically upward. Then, the transportation robot 71 reverses the received substrate WT, and holds the substrate WT in a posture in which the mounting surface WTf of the substrate WT faces vertically downward. The transportation robot 71 transfers the substrate WT to the stage 315 of the bonding device 30 while allowing the posture in which the mounting surface WTf of the substrate WT faces vertically downward.

Figure 9A:
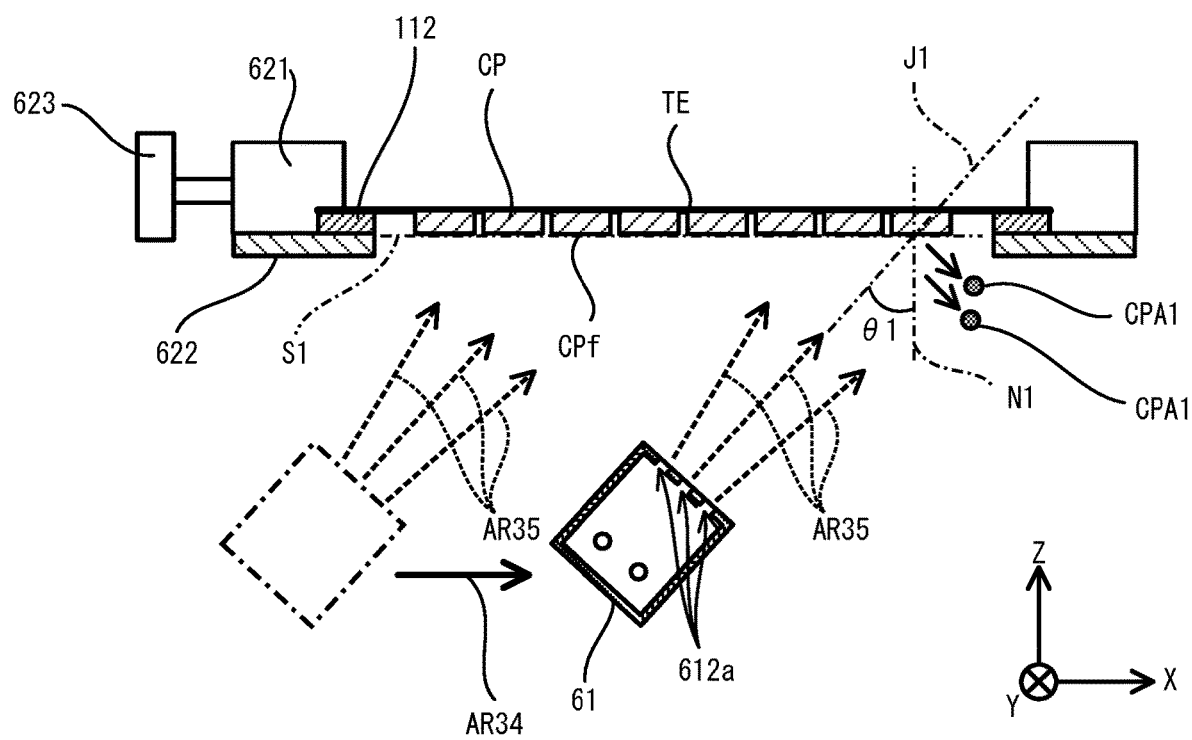
FIG. 9A is a schematic side view illustrating the situation of irradiation with a particle beam in the activation treatment device according to the embodiment.
Figure 9B:
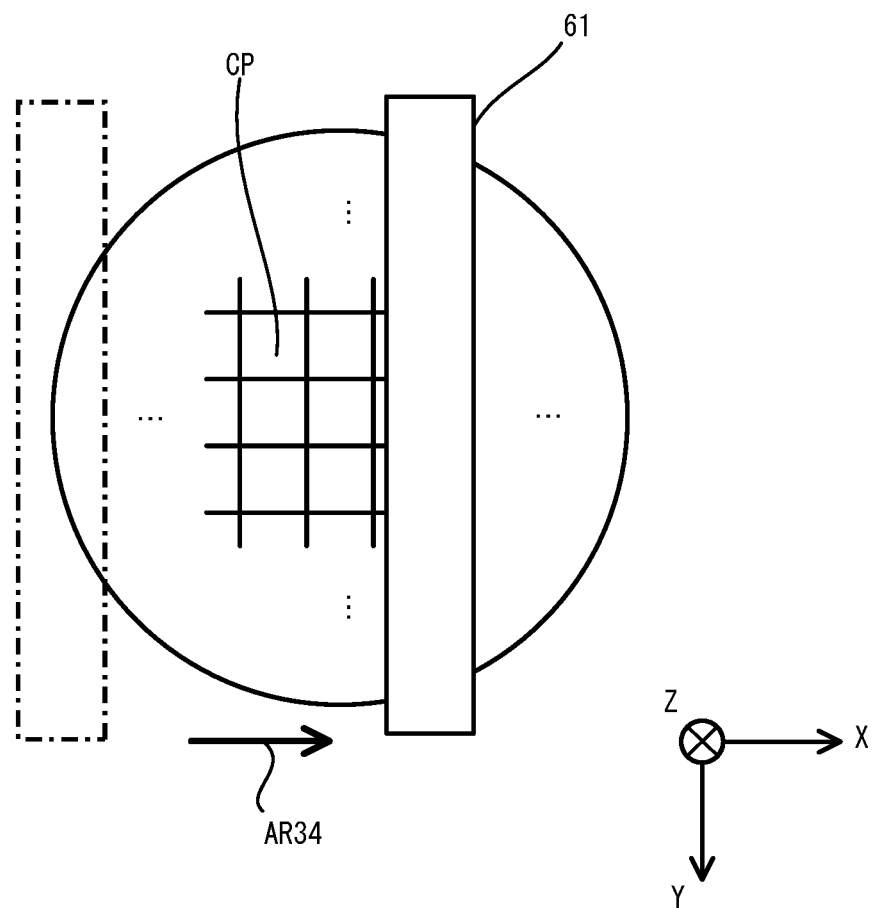
FIG. 9B is a schematic plan view illustrating the situation of irradiation with a particle beam in the activation treatment device according to the embodiment.

Then, the chip bonding system 1 executes a step of activating a bonding surface of a chip, in which the bonding surfaces CPf of the chips CP are subjected to activation treatment by putting the holding frame 112 that holds the sheet TE, to which the chips CP put from the export and import unit 80 are stuck, into the activation treatment device 60 (step S4). First, the activation treatment device 60 allows the supporter 62 to support the holding frame 112 in a posture in which one side, to which the chips CP are stuck, in the sheet TE is opposed to the particle beam source 61, that is, in a posture in which the one side faces vertically downward. The activation treatment device 60 executes a first activating step of irradiating the bonding surface CPf of each of the chips CP in the state of being stuck to the sheet TE with a particle beam from the particle beam source 61. The activation treatment device 60 prepares only the one holding frame 112 that holds the sheet TE to which the plurality of chips CP is stuck, and irradiates the chips CP stuck to the sheet TE held on the prepared holding frame 112, with a particle beam. The activation treatment device 60 moves the particle beam source 61 in the X-axis direction while irradiating the bonding surfaces CPf of the chips CP with a particle beam, for example, as indicated by the arrow AR34 in FIG. 9A and FIG. 9B. For example, the activation treatment device 60 irradiates the bonding surfaces CPf of all the chips CP stuck to a sheet TE with a particle beam while moving the particle beam source 61 in the +X-direction, and then irradiates the bonding surfaces CPf of the chips CP with a particle beam while moving the particle beam source 61 in the −X-direction. The movement rate of the particle beam source 61 is set at, for example, 1.2 to 14.0 mm/sec. Further, an angle (incidence angle) θ1 between the illumination axis J1 of a particle beam and the normal direction N1 of a virtual surface S1, illustrated in FIG. 9A, is set to be 30 degrees or more and 80 degrees or less. An electric power supplied to the particle beam source 61 is set at, for example, 1 kV, 100 mA. The flow rate of nitrogen gas introduced into the discharge chamber 612 of the particle beam source 61 is set at, for example, 100 sccm. In such a case, impurities CPA1 generated from the chips CP or the sheet TE are transferred in a direction of increasing a distance from the chips CP, and do not return toward the bonding surfaces CPf of the chips CP.

Figure 10A:
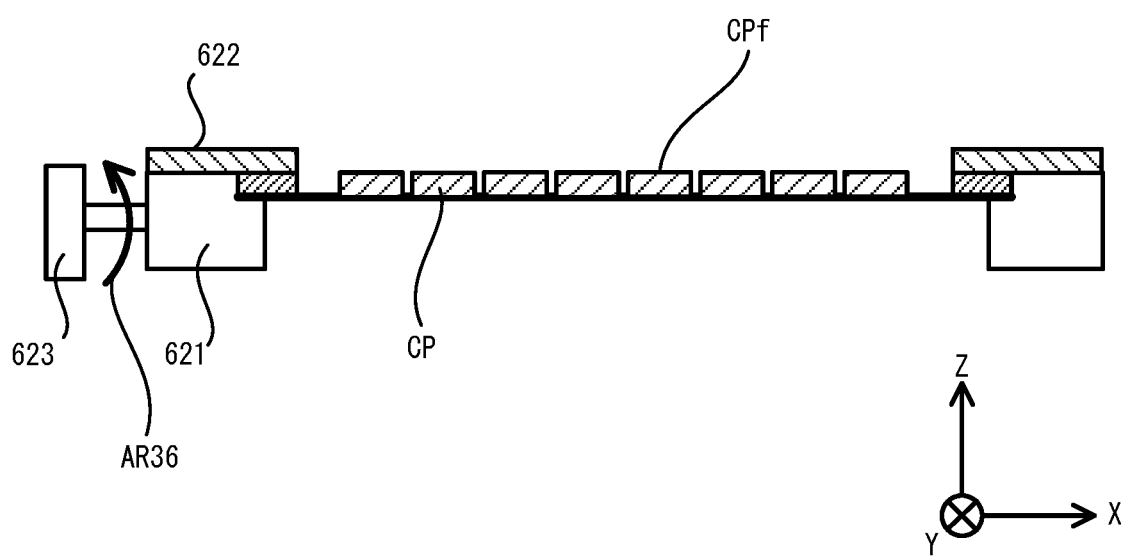
FIG. 10A is a schematic side view illustrating a situation in which a sheet is reversed in the activation treatment device according to the embodiment.
Figure 10B:
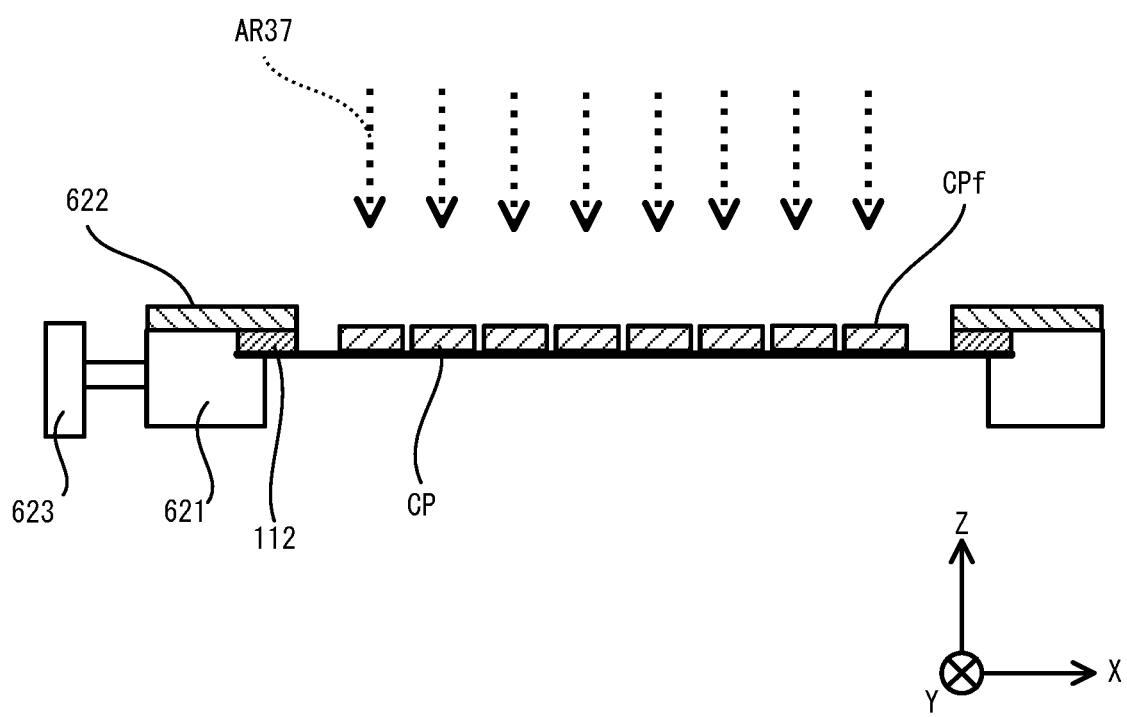
FIG. 10B is a schematic side view illustrating the situation of irradiation with nitrogen radicals in the activation treatment device according to the embodiment.

Then, the activation treatment device 60 reverses the holding frame 112 held by the frame holder 621, as indicated by the arrow AR36 in FIG. 10A, to thereby allow the holding frame 112 to be in a posture in which the bonding surfaces CPf of the chips CP stuck to the sheet TE face vertically upward. The activation treatment device 60 executes a second activating step of allowing the radical source 67 to irradiate the bonding surfaces CPf of the chips CP with nitrogen radicals, as indicated by the arrows AR37 in FIG. 10B. In such a case, an electric power supplied to the plasma chamber 671 in the radical source 67, the flow rate of nitrogen gas introduced into the plasma chamber 671, and a time period of irradiation with nitrogen radicals are set at, for example, conditions similar to those of the above-mentioned step of activating a mounting surface of a substrate.

Referring back to FIG. 8, the chip bonding system 1 then executes a chip preparation step of performing preparation for allowing the chip supply 11 of the chip supply device 10 to hold the holding frame 112 that holds the sheet TE, to which the chips CP are stuck, to bond the chips CP to the substrate WT (step S5). In such a case, the transportation robot 71 receives, from the activation treatment device 60, the holding frame 112 that holds the sheet TE in a posture in which the bonding surfaces CPf of the chips CP face vertically upward. Then, the transportation robot 71 transfers the received holding frame 112, on an as-is basis, to the chip supply 11 of the chip supply device 10.

Figure 11A:
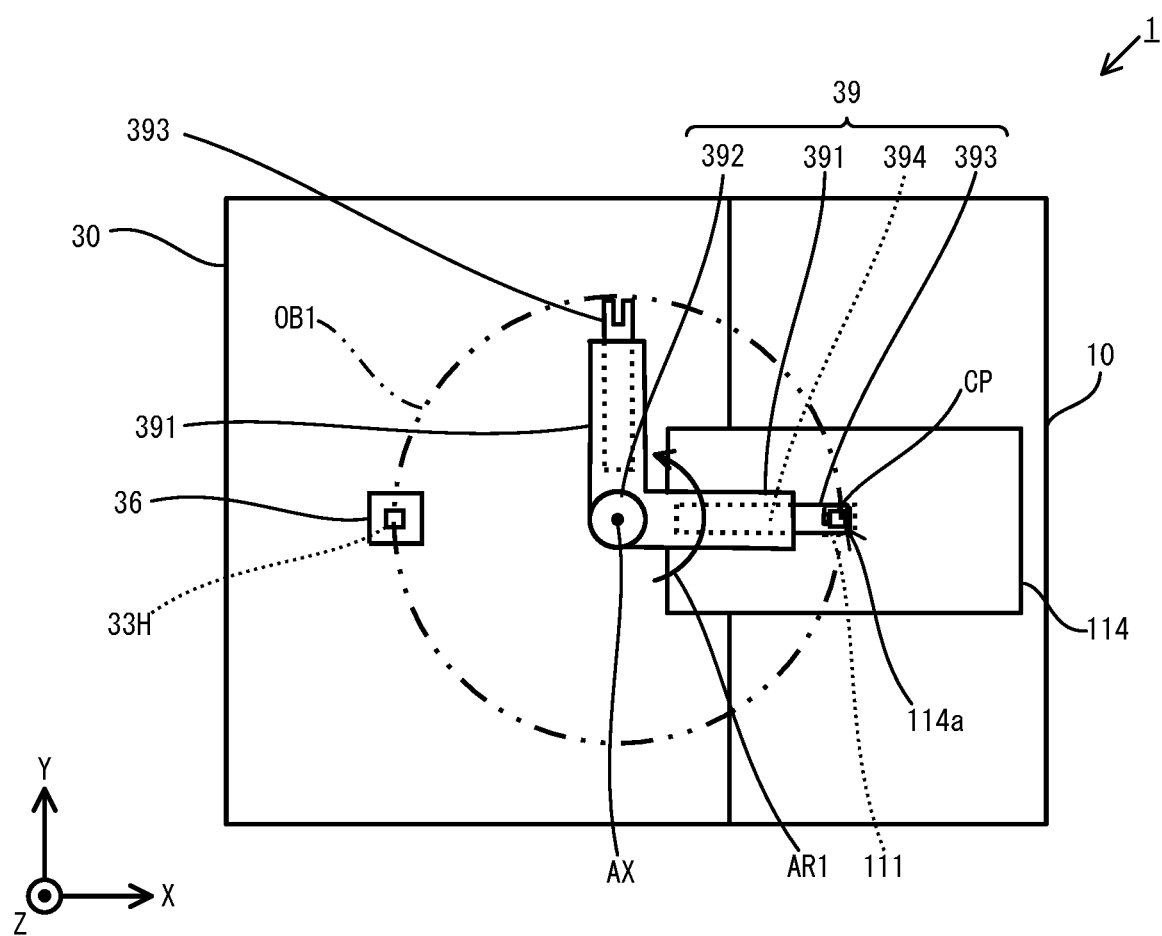
FIG. 11A is a schematic plan view illustrating a situation in which a chip is supplied from a chip supply in the chip bonding system according to the embodiment.
Figure 11B:
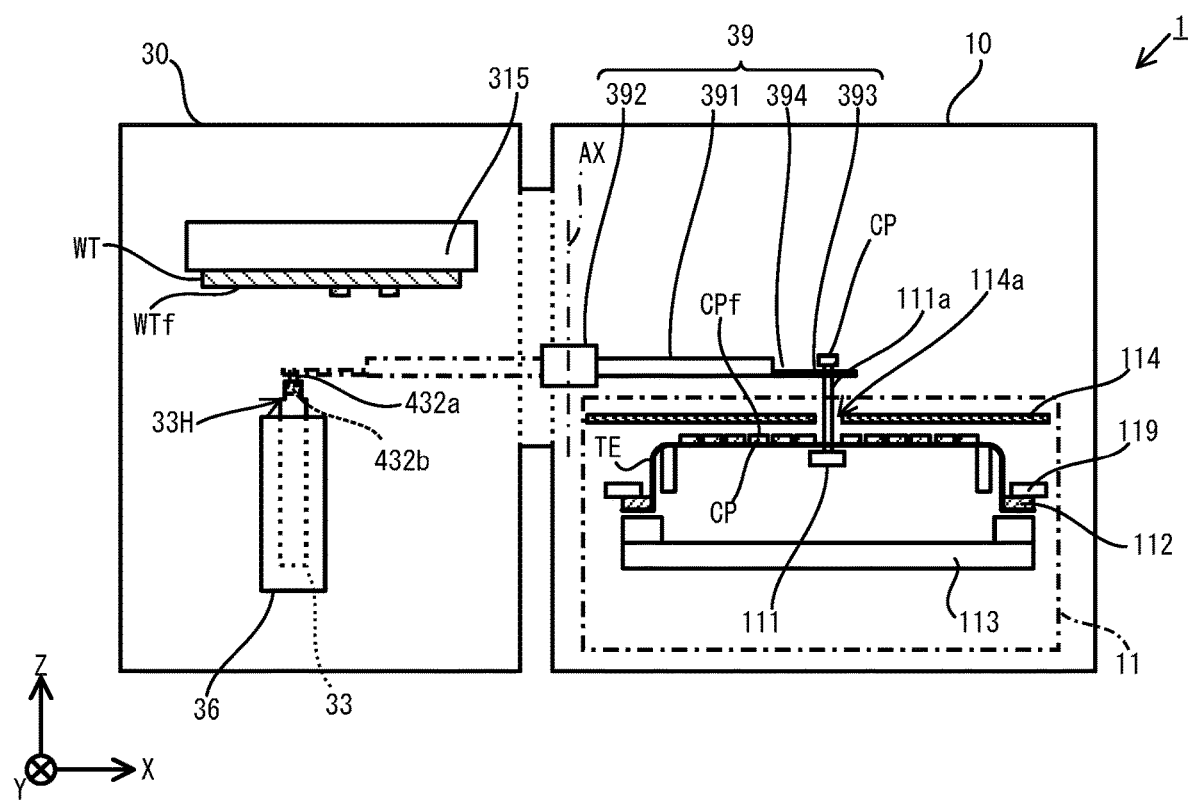
FIG. 11B is a schematic side view illustrating the situation in which the chip is supplied from the chip supply in the chip bonding system according to the embodiment.

Subsequently, the chip bonding system 1 executes a chip bonding step of bringing the chips CP, of which bonding surfaces CPf are activated by the activation treatment device 60, into contact with the mounting surface WTf of the substrate WT, to thereby bond the chips CP to the substrate WT (step S6). In such a case, first, the chip bonding system 1 allows one plate 391 of the chip transportation device 39 to be in the state of being directed to the chip supply 11. Then, a chip supply step (step of supplying a second article to be bonded) is executed in which the pick-up mechanism 111 moves vertically upward, whereby one chip CP is cut from a side opposite to the plurality of chips CP in the sheet TE, and the one chip CP is allowed to be in the state of being detached from the sheet TE. In this state, the chip transportation device 39 allows the arm 394 to protrude from the plate 391. In such a case, a state is achieved in which the needles 111a of the pick-up mechanism 111 are placed between the two leg pieces 393a of the chip holder 393. In such a manner, a state is achieved in which the chips CP can be transferred to the chip holder 393, as illustrated in FIG. 11A and FIG. 11B. When the pick-up mechanism 111 is moved vertically downward from the state, the chips CP are transferred to the chip holder 393.

Figure 12A:
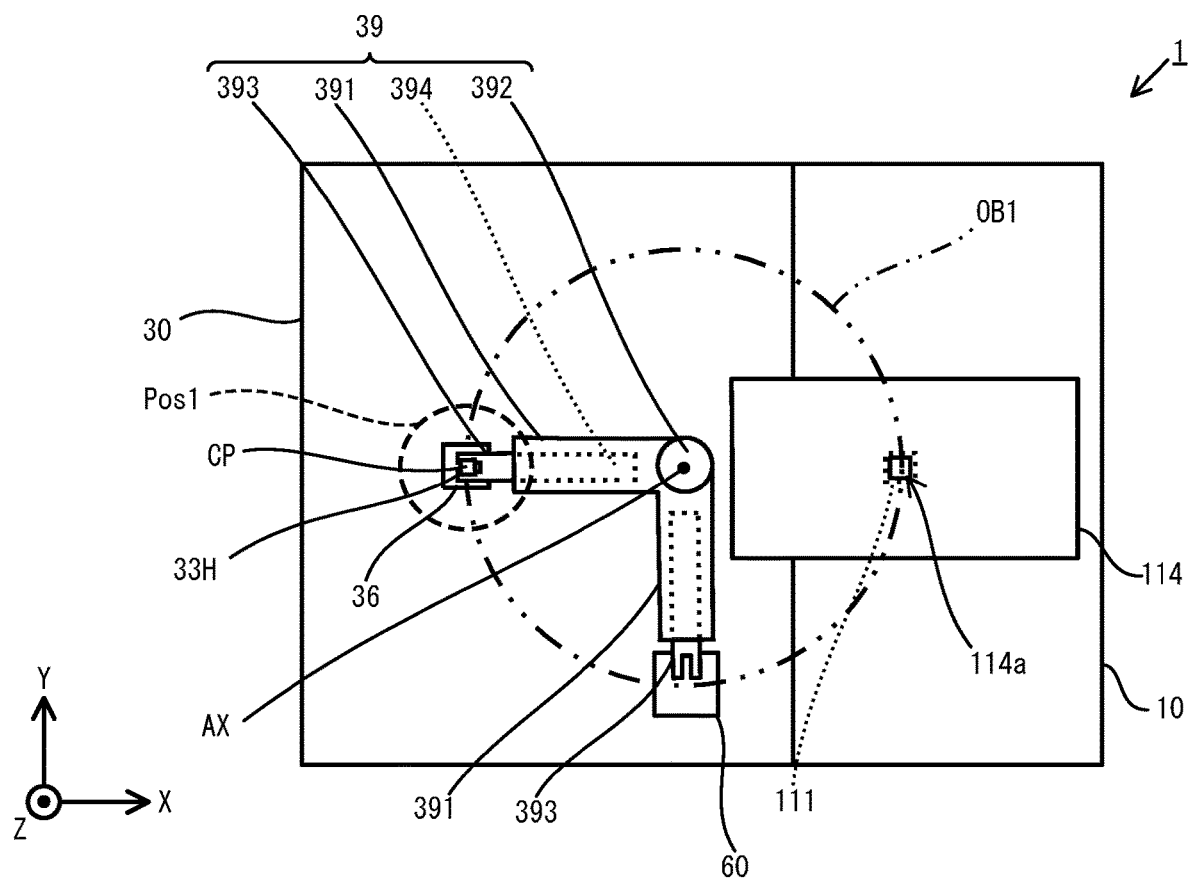
FIG. 12A is a schematic plan view illustrating a situation in which a chip is transferred from a chip transporter to the head in the chip bonding system according to the embodiment.
Figure 12B:
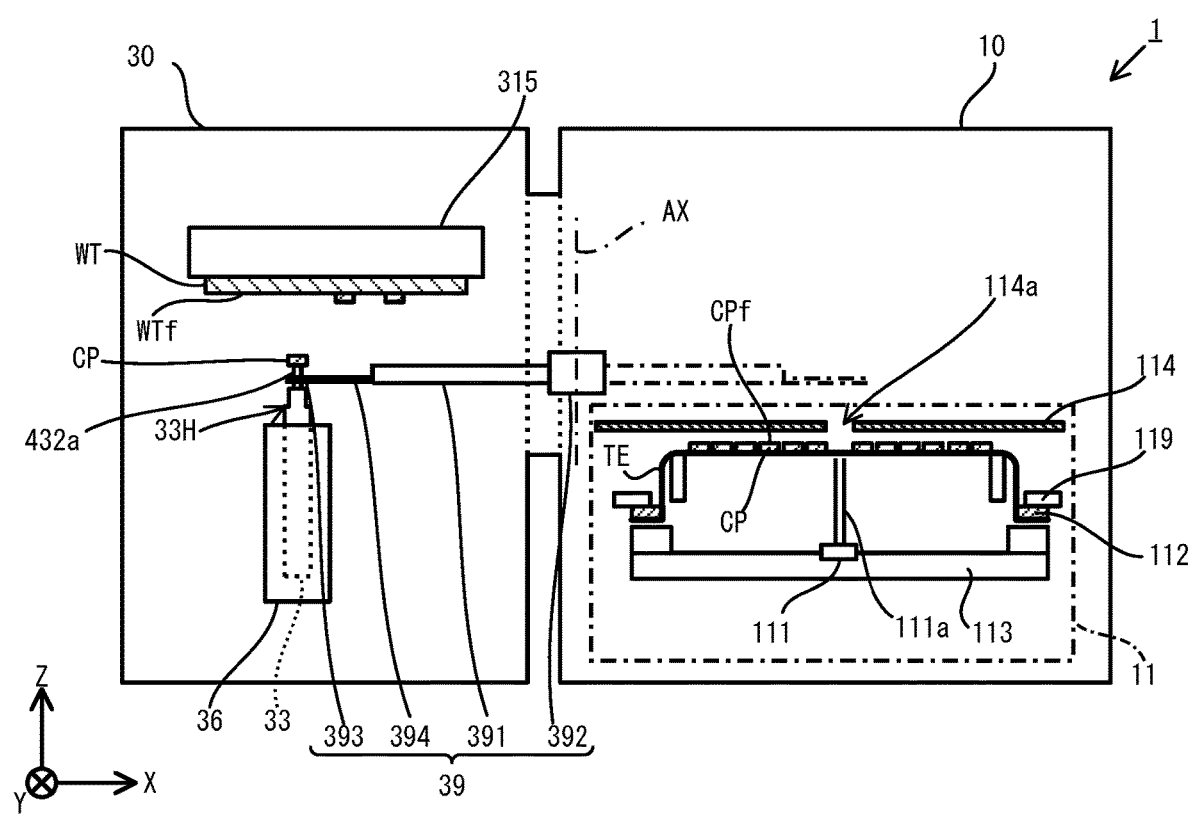
FIG. 12B is a schematic side view illustrating the situation in which the chip is transferred from the chip transporter to the head in the chip bonding system according to the embodiment.

Subsequently, the chip bonding system 1 rotates the plates 391 in the direction of the arrow AR1 in FIG. 11A. In such a case, the chip holder 393 on the leading end of each of the arms 394 of the chip transportation device 39 is placed at a transfer position Pos1 vertically upward the head 33H of the bonder 33, as illustrated in FIG. 12A. In other words, the chip transportation device 39 transports the chip CP, received from the chip supply 11, to the transfer position Pos1 to which the chip CP is transferred to the head 33H. The head driver 36 vertically upward moves the bonder 33 to allow the head 33H to approach the chip holder 393 of the chip transportation device 39. Then, the supporter driver 432b vertically upward moves the chip supporter 432a. As a result, the chip CP held by the chip holder 393 is placed vertically above the chip holder 393 in the state of being supported on the upper end of the chip supporter 432a, as illustrated in FIG. 12B. Subsequently, the chip transportation device 39 deeply inserts the arm 394 into the plate 391. Then, the supporter driver 432b vertically downward moves the chip supporter 432a. As a result, a state is achieved in which the chip CP is held on the leading end of the head 33H.

Then, the chip bonding system 1 executes alignment for correcting relative positional deviation between the chip CP and the substrate WT by rotating the bonder 33 while driving the stage 315. The chip bonding system 1 bonds the chip CP to the substrate WT by lifting the head 33H. In such a case, a state is achieved in which hydrophilic bonding occurs between the mounting surface WTf of the substrate WT and the bonding surface CPf of the chip CP through a hydroxyl group (an OH group).

After completion of the series of steps described above, the substrate WT in a state in which the chip CP is mounted on the substrate WT is taken out of the chip bonding system 1, then put in a heat treatment device (not illustrated), and subjected to heat treatment. The heat treatment device executes the heat treatment of the substrate WT under conditions of, for example, a temperature of 350° C. and 1 hour.

The results of the evaluation of a bonding strength between the chip CP and the substrate WT bonded to each other by the chip bonding system according to the present embodiment will now be described. The results of the evaluation of a bonding strength between the chip CP and the substrate WT bonded to each other by the chip bonding method according to the present embodiment, and the results of the evaluation of a bonding strength between a chip CP and a substrate WT bonded to each other by chip bonding methods according to three kinds of Comparative Examples 1, 2, and 3 will now be described. First, the chip bonding methods according to Comparative Examples 1, 2, and 3 will be described.

Figure 13:
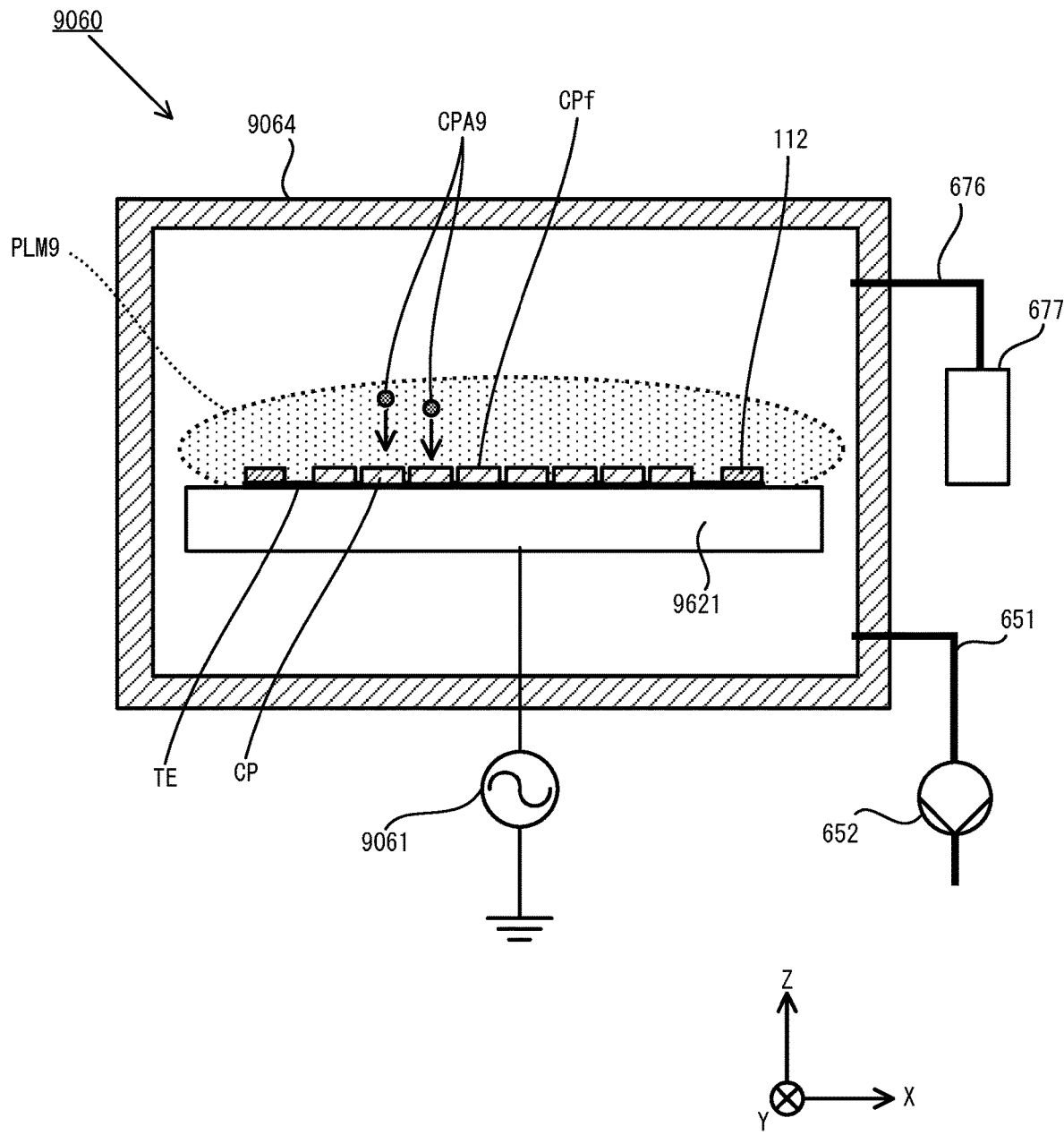
FIG. 13 is a schematic configuration view of an activation treatment device according to Comparative Example.

The chip bonding method according to Comparative Example 1 differs from the chip bonding method according to the embodiment in view of use of an activation treatment device 9060 as illustrated in FIG. 13 in the step of activating a bonding surface of a chip, described with reference to FIG. 8. The activation treatment device 9060 includes: a chamber 9064; a stage 9621 that supports a holding frame 112; a high-frequency power source 9061 that applies a high-frequency bias; and a gas supply 677 that supplies nitrogen gas into the chamber 9064 through a supply pipe 676. In FIG. 13, configurations similar to those of the activation treatment device 60 according to the embodiment are denoted by the same reference characters as those in FIG. 5. The high-frequency power source 9061 applies a high-frequency bias to chips CP stuck to a supported sheet TE held by the holding frame 112 supported on the stage 9621. Examples of the high-frequency power source 9061 include a high-frequency power source that generates a high-frequency bias of 13.56 MHz. Sheath regions PLM9 in which ions having kinetic energy repeatedly collide with the chips CP and the sheet TE are generated in the vicinities of the sheet TE and bonding surfaces CPf of the chips CP by applying a high-frequency bias to the chips CP by the high-frequency power source 9061 in such a manner. The bonding surfaces CPf of the chips CP are activated by the ions having the kinetic energy existing in the sheath regions PLM9. In such a case, ionized impurities existing in the sheath regions PLM9, among the impurities CPA9 generated from the chips CP or the sheet TE, also collide with the bonding surfaces CPf of the chips CP.

The chip bonding method according to Comparative Example 2 differs from the chip bonding method according to the embodiment in view of use of an activation treatment device in which the radical source 67 described in the embodiment is disposed in the activation treatment device 9060 described above in the step of activating a bonding surface of a chip, described with reference to FIG. 8. In other words, in the chip bonding method according to Comparative Example 2, bonding surfaces CPf of chips CP are subjected to activation treatment by applying a high-frequency bias to the chips CP, and the bonding surfaces CPf of the chips CP are then irradiated with nitrogen radicals.

The chip bonding method according to Comparative Example 3 differs from the chip bonding method according to the embodiment in view of performing only irradiation of bonding surfaces CPf of chips CP with a particle beam by an activation treatment device 60, and of performing no irradiation of the bonding surfaces CPf of the chips CP with nitrogen radicals in the step of activating a bonding surface of a chip, described with reference to FIG. 8. In the chip bonding methods according to Comparative Examples 1 to 3 and the embodiment, an activation treatment device having a configuration including a plate electrode disposed on a glass window 674 and a high-frequency power source electrically connected to the plate electrode, instead of the magnetron 672 and the waveguide 673 in the activation treatment device 60 illustrated in FIG. 5, was used as the activation treatment device used in the irradiation of the bonding surfaces CPf of the chips CP with nitrogen radicals.

The results of the evaluation of a bonding strength between the chips CP and the substrate WT bonded closer to each other in the chip bonding methods according to Comparative Examples 1 to 3 and the chip bonding method according to the embodiment will now be described. In such as case, a glass ($SiO_2$) substrate was adopted as the substrate WT. A chip in which only SiON was exposed to a bonding surface CPf, a chip in which SiON and Cu were exposed to a bonding surface CPf, a chip in which a resin and Cu were exposed to a bonding surface CPf, a chip in which SiON and an alloy containing lead and tin as main components (hereinafter referred to as "solder") were exposed to a bonding surface CPf, and a chip in which resin and solder were exposed to a bonding surface CPf were adopted as the chips CP. In other words, a chip in which only a region including SiON existed in a bonding surface CPf, a chip in which a region including SiON and a region including Cu were formed in a bonding surface CPf, a chip in which a region including a resin and a region including Cu were formed in a bonding surface CPf, a chip in which a region including SiON and a region including solder were formed in a bonding surface CPf, and a chip in which a region including a resin and a region including solder were formed in a bonding surface CPf were adopted as the chips CP. The evaluation of the bonding strength was performed for 40 kinds of samples 1 to 40 with combinations of the kind of gas used in activation treatment of bonding surfaces CPf of chips CP, an adopted chip bonding method, and the kind of the chips CP, different from each other.

In each of the steps of activating a bonding surface of a chip according to Comparative Examples 1 and 2, the bias power of the high-frequency bias applied to the chips CP was set at 110 W. A time period in which the application of the high-frequency bias to the chips CP continued was set at 30 sec. A vacuum degree in the chamber 64 in each of the steps of activating a bonding surface of a chip according to Comparative Examples 1 and 2 was set at 50 Pa for each sample. In contrast, in each of the steps of activating a bonding surface of a chip according to Comparative Example 3 and the embodiment, the vacuum degree in the chamber 64 at the time of the irradiation with the particle beam was set at $5.0 \times 10^{-3}$ Pa for each sample. Further, in each of the steps of activating a bonding surface of a chip according to Comparative Example 2 and the embodiment, the electric power supplied from the high-frequency power source to the plasma chamber 671 in the case of the irradiation with the nitrogen radicals was set at 250 W.

For each sample after the completion of the bonding of the chips CP to the substrate WT by the chip bonding methods according to Comparative Examples 1 to 3 and by the chip bonding method according to the embodiment, the heat treatment device performed heat treatment of the substrate WT under conditions of a temperature of 350° C. and 1 hour. For each of 40 kinds of the samples 1 to 40, materials exposed to the bonding surface CPf of the chips CP, and treatment conditions in the step of activating a bonding surface of a chip are listed in Table 1. For each sample, the materials exposed to the bonding surface CPf of the chips CP are listed in the column of "materials exposed to bonding surface" in Table 1. Moreover, for each sample, an activation treatment method adopted in the step of activating a bonding surface of a chip is listed in the column of "step of activating bonding surface of chip". Specifically, "Comparative Example 1" shows that the step of activating a bonding surface of a chip according to Comparative Example 1 as described above was adopted, "Comparative Example 2" shows that the step of activating a bonding surface of a chip according to Comparative Example 2 as described above was adopted, and "Comparative Example 3" shows that the step of activating a bonding surface of a chip according to Comparative Example 3 as described above was adopted. Moreover, "Embodiment" shows that the step of activating a bonding surface of a chip according to the embodiment described with reference to FIG. 8 as described above was adopted. Moreover, for the samples 1 to 20, in the step of activating a bonding surface of a chip, gas introduced into the chamber 9064 at the time of applying the high-frequency bias to the chips CP, or gas introduced into the discharge chamber 612 of the particle beam source 61 at the time of the irradiation with the particle beam was allowed to be nitrogen gas. In contrast, for the samples 21 to 40, in the step of activating a bonding surface of a chip, gas introduced into the chamber 9064 at the time of applying the high-frequency bias to the chips CP, or gas introduced into the discharge chamber 612 of the particle beam source 61 at the time of the irradiation with the particle beam was allowed to be argon (Ar) gas.

TABLE 1

|  | Materials exposed to bonding surface | Step of activating bonding surface of chip |
|---|---|---|
| Sample 1 and 21 | SiON | Comparative Example 1 |
| Sample 2 and 22 | SiON and Cu | Comparative Example 1 |
| Samples 3 and 23 | SiON and Resin | Comparative Example 1 |
| Samples 4 and 24 | SiON and Solder | Comparative Example 1 |
| Samples 5 and 25 | Resin and Solder | Comparative Example 1 |
| Samples 6 and 26 | SiON | Comparative Example 2 |
| Samples 7 and 27 | SiON and Cu | Comparative Example 2 |
| Samples 8 and 28 | SiON and Resin | Comparative Example 2 |
| Samples 9 and 29 | SiON and Solder | Comparative Example 2 |
| Samples 10 and 30 | Resin and Solder | Comparative Example 2 |
| Samples 11 and 31 | SiON | Comparative Example 3 |
| Samples 12 and 32 | SiON and Cu | Comparative Example 3 |
| Samples 13 and 33 | SiON and Resin | Comparative Example 3 |
| Samples 14 and 34 | SiON and Solder | Comparative Example 3 |
| Samples 15 and 35 | Resin and Solder | Comparative Example 3 |
| Samples 16 and 36 | SiON | Embodiment |
| Samples 17 and 37 | SiON and Cu | Embodiment |
| Samples 18 and 38 | SiON and Resin | Embodiment |
| Samples 19 and 39 | SiON and Solder | Embodiment |
| Samples 20 and 40 | Resin and Solder | Embodiment |

The evaluation of the bonding strength between the chips CP and the substrate WT for the samples 1 to 40 was performed by measuring the bonding strength (in terms of surface energy) using a crack and opening method in which a blade is inserted. In the crack and opening method, first, the peeling lengths of the chips CP in the case of inserting blades such as, for example, razor blades from the peripheries of the chips CP in the chips CP and the substrate WT, bonded to each other, to bonded portions are measured. For example, blades having a thickness of 100 μm are used as the blades. Moreover, peeling lengths from blade contact points in the case of inserting the blade into four places of the peripheral portions of the chips CP bonded to the substrate WT were measured. The bonding strength between the chips CP and the substrate WT was evaluated by calculating the strength of the bonded interface between the chips CP and the substrate WT from the peeling length in terms of surface energy per unit area for each of the four places of the peripheral portions of the chips CP. The relational equation of the following Equation (2) was used for calculating the bonding strength (in terms of surface energy) Eb from the peeling length.

[Equation 2]

$$Eb = \frac{3 \times Y \times Ts^3 \times Tb^2}{32 \times L^4} \quad \text{Equation (2)}$$

In the equation, Y represents a Young's modulus, Ts represents the thickness of the chips CP and the substrate WT, and Tb represents the thickness of the blade. In the evaluation of the bonding strength between the chips CP and the substrate WT for the samples 1 to 40, the Young's modulus Y was set at $6.5 \times 10^{10}$ [N/m$^2$], the chips CP and the substrate WT was set at 0.0011 m (1.1 mm), and the thickness Tb of the blade was set at 0.0001 m (0.1 mm). The calculation equation reveals that a shorter peeling length results in a higher bonding strength.

The average value of bonding strengths (in terms of surface energy) in the four places of the peripheral portions of the chips CP of each of the samples 1 to 40 is set forth in Table 2 and Table 3. In Table 2 and Table 3, the column of "Sample name" corresponds to each of Samples 1 to 40 in Table 1 described above. Moreover, the increased bonding strength (in terms of surface energy) calculated for each sample shows the increased bonding strength between the chips CP and the substrate WT, and "Bulk Fracture" is described for a sample of which bulk fracture occurred. Moreover, in the column of "Did successful bonding occur?" in Table 2 and Table 3, a case in which a chip CP was able to be bonded to a substrate WT is denoted by "Yes", and a case in which a chip CP was unable to be bonded to a substrate WT is denoted by "No". A bonding strength is calculated only for a sample in which a chip CP was able to be bonded to a substrate WT.

TABLE 2

|  | Bonding strength (in terms of surface energy) (J/m$^2$) | Did bulk fracture occur? | Did successful bonding occur? |
|---|---|---|---|
| Sample 1 | >2.5 | Yes | Yes |
| Sample 2 | — | — | No |
| Sample 3 | — | — | No |
| Sample 4 | — | — | No |
| Sample 5 | — | — | No |
| Sample 6 | >2.5 | Yes | Yes |
| Sample 7 | — | — | No |
| Sample 8 | — | — | No |
| Sample 9 | — | — | No |
| Sample 10 | — | — | No |
| Sample 11 | 2.3 | No | Yes |
| Sample 12 | 2.3 | No | Yes |
| Sample 13 | 2.3 | No | Yes |
| Sample 14 | 2.0 | No | Yes |
| Sample 15 | 2.0 | No | Yes |
| Sample 16 | >2.5 | Yes | Yes |
| Sample 17 | >2.5 | Yes | Yes |
| Sample 18 | >2.5 | Yes | Yes |
| Sample 19 | 2.3 | No | Yes |
| Sample 20 | 2.1 | No | Yes |

TABLE 3

|  | Bonding strength (in terms of surface energy) (J/m$^2$) | Did bulk fracture occur? | Did successful bonding occur? |
|---|---|---|---|
| Sample 21 | 2.3 | No | Yes |
| Sample 22 | — | — | No |
| Sample 23 | — | — | No |
| Sample 24 | — | — | No |
| Sample 25 | — | — | No |
| Sample 26 | 2.2 | No | Yes |
| Sample 27 | — | — | No |
| Sample 28 | — | — | No |
| Sample 29 | — | — | No |
| Sample 30 | — | — | No |
| Sample 31 | 2.0 | No | Yes |
| Sample 32 | 2.0 | No | Yes |
| Sample 33 | 2.0 | No | Yes |
| Sample 34 | 1.8 | No | Yes |
| Sample 35 | 1.8 | No | Yes |
| Sample 36 | 2.3 | No | Yes |
| Sample 37 | 2.3 | No | Yes |
| Sample 38 | 2.3 | No | Yes |
| Sample 39 | 2.0 | No | Yes |
| Sample 40 | 1.9 | No | Yes |

The evaluation results of Samples 2 to 5, 7 to 10, 22 to 25, and 27 to 30 in Table 2 and Table 3 reveal that it is impossible to bond a chip CP to a substrate WT in the cases of adopting the steps of activating a bonding surface of a chip according to Comparative Examples 1 and 2, and of exposing Cu, a resin or solder to the bonding surface CPf of the chip CP. Based on the above, damage to the bonding surface CPf, caused by collision of impurities generated from Cu, a resin, or solder with the bonding surface CPf, is considered to be increased to such a degree that it is impossible to bond the chip CP to the substrate WT, in the case of adopting the steps of activating a bonding surface of a chip according to Comparative Examples 1 and 2. However, the evaluation results of Samples 1, 6, 21, and 26 reveal that even in the case of adopting the steps of activating a bonding surface of a chip according to Comparative Examples 1 and 2, it is possible to bond the chip CP to the substrate WT when only SiON is exposed to the bonding surface CPf of the chip CP.

In contrast, the evaluation results of Samples 11 to 20, and 31 to 40 in Table 2 and Table 3 reveal that it is possible to bond a chip CP to a substrate WT even in the cases of adopting the steps of activating a bonding surface of a chip according to Comparative Example 3 and the embodiment, and of exposing Cu, a resin, or solder to the bonding surface CPf of the chip CP. This is considered to be because in the case of activating the bonding surface CPf by irradiating the bonding surface CPf of the chip CP with a particle beam, a high-frequency bias is not applied to the chip CP, and therefore, damage to the bonding surface CPf, caused by collision of impurities generated from Cu, a resin, or solder with the bonding surface CPf, is suppressed. Based on the above, in the case of exposing Cu, a resin, or solder to the bonding surface CPf of the chip CP, adoption of a method of activating the bonding surface CPf of the chip CP by irradiation with a particle beam in the step of activating a bonding surface of a chip can be considered to be important for achieving favorable bonding to the substrate WT of the chip CP.

Further, comparisons between the bonding strengths of Samples 21 to 30 and the bonding strengths of Samples 31 to 40 reveal that the bonding strengths of Samples 21 to 30 are higher than the bonding strengths of Samples 31 to 40. Based on the above, as gas introduced into the discharge chamber 612 of the particle beam source 61 in the case of irradiating the bonding surface CPf of the chip CP with a particle beam, nitrogen gas is found to be preferable to Ar gas from the viewpoint of improvement in the bonding strength between the chip CP and the substrate WT. The reason that the bonding strength between the chip CP and the substrate WT in the case of using the nitrogen gas is improved in comparison with the case of using the Ar gas as described above is considered to be that the mass of Ar is more than that of nitrogen, and therefore, even if an OH group is generated on the bonding surface CPf of the chip CP, the OH group is caused to fly due to collision of Ar. Moreover, comparisons between the bonding strengths of Samples 21 to 25 and the bonding strengths of Samples 26 to 30 reveal that the bonding strengths of Samples 21 to 25 are higher than the bonding strengths of Samples 26 to 30. Based on the above, it is found that a case in which the bonding surface CPf of the chip CP is irradiated with a particle beam, followed by irradiating the bonding surface CPf with nitrogen radicals, is preferable from the viewpoint of improvement in the bonding strength between the chip CP and the substrate WT.

Similar evaluation of each of the samples 1 to 4, 6 to 9, 11 to 14, 16 to 19, 21 to 24, 25 to 29, 31 to 34, and 35 to 39 except that an oxide SiON was changed to an oxide $SiO_2$ and a nitride SiN leaded to results similar to the results described above. A result was obtained that in the case of using oxygen gas instead of nitrogen gas, when a metal such as Cu or solder exists on the bonding surface CPf of the chip CP, the metal is oxidized by oxygen, and the connection resistance between the chip CP and the substrate WT is deteriorated. Likewise, a result was obtained that the case of using nitrogen gas is the most favorable even in the case of performing plasma treatment of the bonding surface CPf of the chip CP instead of irradiation of the bonding surface CPf of the chip CP with a particle beam by using the particle beam source 61 as described above. In other words, even if a metal such as Cu or solder exists on the bonding surface CPf of the chip CP, use of nitrogen gas is considered to enable an OH group to be most effectively generated on the bonding surface CPf of the chip CP without oxidizing the metal.

In accordance with the chip bonding system 1 according to the present embodiment, the supporter 62 in the activation treatment device 60 holds one side to which the chip CP is stuck in the sheet TE to which the chip CP is stuck in the posture of facing the particle beam source 61, as described above. The particle beam source 61 irradiates the bonding surface CPf of the chip CP in the state of being stuck to the sheet TE, with a particle beam. In other words, the bonding surface CPf is activated by irradiating the bonding surface CPf of the chip CP stuck to the sheet TE, with a particle beam. As a result, impurities generated from the sheet TE or the chip CP by irradiation with the particle beam are inhibited from colliding with the bonding surface CPf of the chip CP, and damage to the bonding surface CPf of the chip CP, caused by the collision of the impurities, is suppressed. Accordingly, occurrence of poor bonding between the chip CP and the substrate WT is suppressed.

Moreover, in the chip bonding system 1 according to the present embodiment, the chip CP to be bonded to the substrate WT may be a chip CP in which a plurality of kinds of regions of which the materials are different from each other are formed on a bonding surface CPf thereof. In such a case, impurities generated from each of the plurality of the kinds of the regions in the bonding surface CPf of the chip CP by irradiation with a particle beam are inhibited from colliding with the bonding surface CPf of the chip CP, and damage to the bonding surface CPf of the chip CP, caused by the collision of the impurities, is suppressed.

Moreover, in the chip bonding system 1 according to the present embodiment, the particle beam source 61 is set so that the incidence angle θ1 of a particle beam with respect to the virtual surface S1 including at least one of the bonding surfaces CPf of the plurality of chips CP stuck to the sheet TE is 30 degrees or more and 80 degrees or less. As a result, the sheet TE is inhibited from being irradiated with the particle beam through gaps between the chips CP adjacent to each other, and therefore, impurities are inhibited from being generated from the sheet TE.

Further, the activation treatment device 60 according to the present embodiment includes the cover 622 that covers a portion excluding portions, to which the chips CP are stuck, on one side, to which the chips CP are stuck, of the sheet TE, in a state in which the holding frame 112 that holds the sheet TE to which the chips CP are stuck is held by the frame holder 621. As a result, generation of impurities from the sheet TE due to irradiation of the portion excluding the portions, to which the chips CP are stuck, in the sheet TE, with a particle beam is suppressed.

Moreover, in the activation treatment device 60 according to the present embodiment, the supporter 62 supports the holding frame 112 that holds the sheet TE, to which the chips CP are stuck, in a posture in which the bonding surfaces CPf of the chips CP face vertically downward, when the bonding surfaces CPf of the chips CP are irradiated with a particle beam. The particle beam source 61 irradiates the bonding surfaces CPf of the chips CP with a particle beam from vertically below the supporter 62. As a result, impurities generated by irradiating the sheet TE and the chips CP with the particle beam drop vertically downward due to gravity, and therefore, the impurities are inhibited from adhering to the bonding surfaces CPf of the chips CP.

Further, a particle beam with which the bonding surfaces CPf of the chips CP are irradiated by the particle beam source 61 according to the present embodiment includes nitrogen. As a result, for example, in the above-mentioned step of activating a bonding surface of a chip, a bonding strength between the chips CP and the substrate WT in the case of bonding the chips CP to the substrate WT can be increased in comparison with a configuration of irradiation with a particle beam including Ar.

Moreover, the activation treatment device 60 according to the present embodiment further includes a radical source that irradiates the bonding surfaces CPf of the chips CP with nitrogen radicals. As a result, for example, in the above-mentioned step of activating a bonding surface of a chip, a bonding strength between the chips CP and the substrate WT in the case of bonding the chips CP to the substrate WT can be increased in comparison with a configuration of only irradiation with a particle beam including nitrogen.

When the particle beam source 61 is, for example, an ion gun, a particle beam excessively spreads, and a portion other than the holding frame 112 that holds the sheet TE to which the chips CP are stuck in the chamber 64 is also irradiated with the particle beam. Then, metal contaminants are prone to be generated from the inner wall of the chamber 64. In particular, contamination of metals is unfavorable in the case of performing hydrophilization treatment in the activation treatment device 60, as in the present embodiment. In contrast, a fast particle beam source having high directivity is used as the particle beam source 61 in the present embodiment. As a result, a portion other than the holding frame 112 that holds the sheet TE to which the chips CP are stuck in the chamber 64 is also inhibited from being irradiated with a particle beam. Moreover, the particle beam source 61 including the fast particle beam source is effective because relative scan-movement of the particle beam source 61 with respect to the holding frame 112 in the vicinity of the holding frame 112 that holds the sheet TE to which the chips CP are stuck enables only the chips CP to be irradiated with a particle beam by shielding the outer peripheries of the plurality of chips CP stuck to a region having a circular shape in planar view in the sheet TE1.

A carbon powder is generated from the surrounding wall of the discharge chamber 612 when the particle beam source 61 is a fast atom beam source, and the discharge chamber 612 is formed of a carbon material. In the step of activating a bonding surface of a chip, the carbon powder generated from the surrounding wall of the discharge chamber 612 may fall and adhere to the bonding surfaces CPf of the chips CP in the case of a configuration in which the particle beam source 61 is placed vertically above the chips CP, and irradiation with a particle beam is performed from vertically above the chips CP. In contrast, in accordance with the present embodiment, the particle beam source 61 is placed vertically below the plurality of chips CP. As a result, the carbon powder generated from the particle beam source 61 stays in the discharge chamber 612, and inhibited from being scattered outside the discharge chamber 612, and therefore, adherence of the carbon powder to the bonding surfaces CPf of the chips CP is suppressed. Accordingly, occurrence of poor bonding of the chips CP to the substrate WT is suppressed.

The embodiment of the present disclosure has been described above. However, the present disclosure is not limited to the embodiment described above. For example, the particle beam source 61 of the activation treatment device 60 may be an ion beam source that accelerates and releases nitrogen ions.

The example of the chip bonding system 1 that bonds the chips CP to the substrate WT has been described in the embodiment. Without limitation thereto, however, for example, a substrate bonding system that bonds substrates to each other is also acceptable. In such a case, a step similar to the activating step described, in the embodiment, for a bonding surface of each of the substrates bonded to each other is preferably performed in the activation treatment device 60. For example, when a metal electrode and an insulator film are disposed on the bonding surface of each of the two substrates, it is preferable to irradiate the bonding surfaces of the substrates with a particle beam to perform activation treatment.

In the embodiment, the example of the activation treatment device 60 that moves the particle beam source 61 toward the holding frame 112 that holds the sheet TE to which the chips CP are stuck has been described. Without limitation thereto, however, for example, a configuration is also acceptable in which a particle beam source 61 is fixed, and a holding frame 112 that holds a sheet TE to which chips CP are stuck is moved. Alternatively, a configuration is also acceptable in which a particle beam source 61 and a holding frame 112 that holds a sheet TE to which chips CP are stuck are moved in mutually opposite directions.

A water supply that supplies water gas into the chamber 64 may be disposed in the activation treatment device 60 according to the embodiment. In such a case, the water supply may introduce water vapor into the chamber 64, or may introduce water in liquid form (mist form) into the chamber 64. The water vapor may also be generated by passing nitrogen as carrier gas into, for example, liquid water.

In the embodiment, the example in which the irradiation of the chips CP with the particle beam and the radical treatment of the chips CP are executed in the one activation treatment device 60 has been described. Without limitation thereto, however, for example, a configuration is also acceptable in which irradiation of chips CP with a particle beam and radical treatment of the chips CP are performed by separate devices.

In the embodiment, the example of the chip bonding system 1 has been described in which the chips CP stuck to the sheet TE held by the holding frame 112 are subjected to the steps of activating a bonding surface of a chip, that is, the first activating step and the second activating step, in the activation treatment device 60, followed by putting the holding frame 112 in the chip supply 11 of the chip supply device 10 on an as-is basis. Without limitation thereto, however, it is also acceptable that, for example, the chip bonding system includes a cleaning device (not illustrated) that cleans chips CP in the state of being stuck to a sheet TE held by a holding frame 112, and the chips CP are subjected to a step of activating a bonding surface of a chip, followed by cleaning the chips CP. In such a case, the cleaning device includes, for example, a supporter (not illustrated) that supports the holding frame 112 that holds the sheet TE to which the chips CP are stuck, and a cleaning head (not illustrated) that discharges water to which ultrasonic waves or megasonic vibrations are applied or cleaning liquid that reduces an electrode surface to the chips CP stuck to the sheet TE held by the holding frame 112. A liquid discharged from the cleaning head is not limited to water and the cleaning liquid, but may be another kind of liquid such as an organic solvent. First, the cleaning device rotates the supporter that supports the chips CP while spraying the water to which the ultrasonic waves are applied, or the cleaning liquid on the chips CP stuck to the sheet TE by the cleaning head, to clean the whole bonding surfaces CPf of the chips CP. Then, the cleaning device dries the chips CP and the sheet TE by rotating the supporter in the state of stopping the discharge of the water or the cleaning liquid from the cleaning head. For example, the cleaning device may remove particles adhering to the chip CP by spraying inert gas such as N2 instead of water on the chips CP.

As described in the embodiment, a carbon powder is generated from the surrounding wall of the discharge chamber 612 when the particle beam source 61 is a fast atom beam source, and the discharge chamber 612 is formed of a carbon material. In the step of activating a bonding surface of a chip, the carbon powder generated from the surrounding wall of the discharge chamber 612 may adhere to the bonding surfaces CPf of the chips CP. In contrast, in accordance with the present configuration, occurrence of poor bonding of the chips CP to the substrate WT is suppressed because the step of activating a bonding surface of a chip is performed in the activation treatment device 60, and the bonding surfaces CPf of the chips CP are then cleaned in the cleaning device.

Moreover, a method in which the chips CP are cleaned on a one-by-one basis before the chips CP are bonded to the substrate WT by the bonding device 30 is conceivable as the method of cleaning the bonding surfaces CPf of the chips CP. In such a case, however, a time period required for mounting the plurality of chips CP on the substrate WT is prolonged because of cleaning each of the chips CP. In contrast, in accordance with the present configuration, the plurality of chips CP stuck to the sheet TE can be cleaned at a time. Accordingly, a time period required for mounting the plurality of chips CP on the substrate WT can be shortened.

In the embodiment, the example has been described in which the irradiation of the plurality of chips CP with the particle beam and the radical treatment of the chips CP are executed in a state in which the plurality of chips CP spaced from each other are stuck to the sheet TE in the step of activating a bonding surface of a chip. Without limitation thereto, however, it is also acceptable to, for example, clean the bonding surfaces CPf of the chips CP in the above-mentioned cleaning device in a state in which the plurality of chips CP comes into contact with each other or are connected to each other, after dicing the substrate to be diced, which is a base material of the plurality of chips CP. In such a case, the chip supply device may include an expander that allows the plurality of chips CP stuck to the sheet TE to be in the state of being spaced from each other by expanding the sheet TE held by the holding frame 112. In such a case, it is preferable that the cleaning device cleans the plurality of chips CP stuck to the sheet TE held by the holding frame 112, the holding frame 112 is then put in the chip supply device on an as-is basis, and the chip supply device expands the sheet TE held by the holding frame 112 to thereby allow the plurality of chips CP to be in the state of being spaced from each other. The chip supply device may include a dry unit (not illustrated) that dries the plurality of chips CP and the sheet TE after the expansion of the sheet TE.

In accordance with the present configuration, for example, in the case of cleaning the plurality of chips CP by water or a cleaning liquid, water is inhibited from staying between the plurality of chips CP.

Figure 14A:
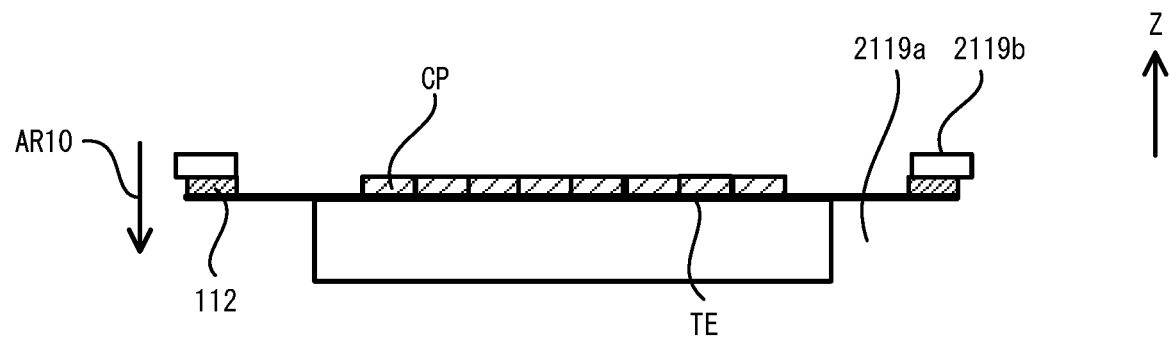
FIG. 14A is a schematic view illustrating a state before movement of a holding frame in the supporters of a cleaning device according to Alternative Example.

Moreover, the above-mentioned cleaning device may include, for example, an inner supporter 2119a and a frame supporter 2119b, as illustrated in FIG. 14A. The inner supporter 2119a supports an inner side of a holding frame 112 in a sheet TE held by the holding frame 112. The frame supporter 2119b supports the holding frame 112, and can move in the −Z-direction with respect to the inner supporter 2119a, as illustrated in the arrow AR10 of FIG. 14A. Moreover, the cleaning device includes: a frame driver (not illustrated) that drives the frame supporter 2119b in the Z-axis direction; and a rotary driver (not illustrated) that rotates the inner supporter 2119a that supports the sheet TE and the frame supporter 2119b that supports the holding frame 112 in the thickness direction of the holding frame 112, that is, about a rotation axis J10 along the Z-axis direction. The frame driver moves the frame supporter 2119b relatively with respect to the inner supporter 2119a after cleaning of the plurality of chips CP with water, whereby a first site PA1, to which the plurality of chips CP is stuck, in the sheet TE, and a second site PA2 fixed to the holding frame 112 are allowed to be in the state of being spaced from each other so that the first site PA1 is closer to the direction of the rotation axis J10 than the second site PA2.

Figure 14B:
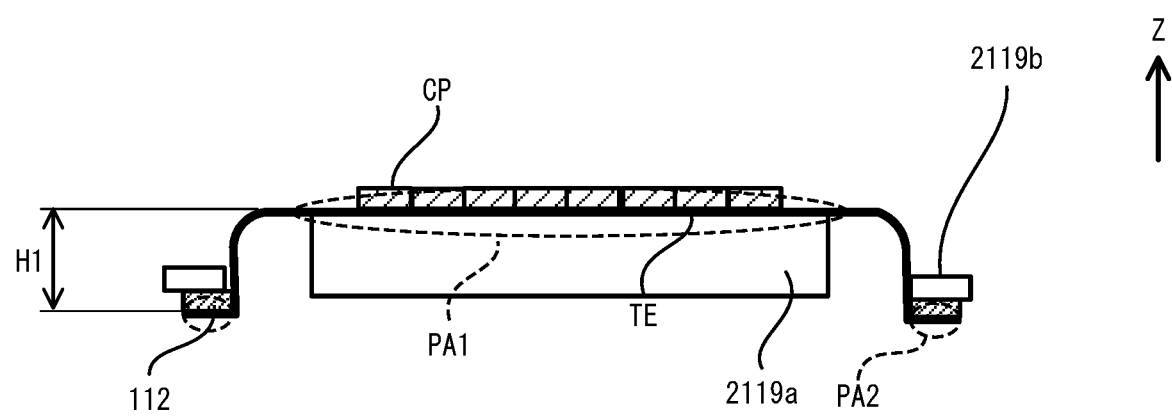
FIG. 14B is a schematic view illustrating a state in which the holding frame is moved in the supporters of the cleaning device according to Alternative Example.

Moreover, the cleaning device further includes a sucker (not illustrated) that sucks the first site PA1, to which the plurality of chips CP is stuck, in the sheet TE, from a side opposite to the chips CP. The frame driver allows the first site PA1 in the sheet TE and the second site PA2 to be in the state of being spaced from each other so that the first site PA1 is closer to the direction of the rotation axis J10 of the sheet TE, that is, the −Z-direction than the second site PA2, as illustrated in FIG. 14B. In such a case, the sucker sucks the plurality of chips CP in the state of coming into contact with each other or in the state of being connected to each other, produced by dicing the substrate to be diced, which is a base material of the plurality of chips CP stuck to the sheet TE. The frame driver moves the frame supporter 2119b in the −Z-direction with respect to the inner supporter 2119a. As a result, the plurality of chips CP stuck to the sheet TE in the state of coming into contact with each other or in the state of being connected to each other are inhibited from being spaced from each other, and therefore, water is inhibited from adhering to between the plurality of chips CP.

Figure 14C:
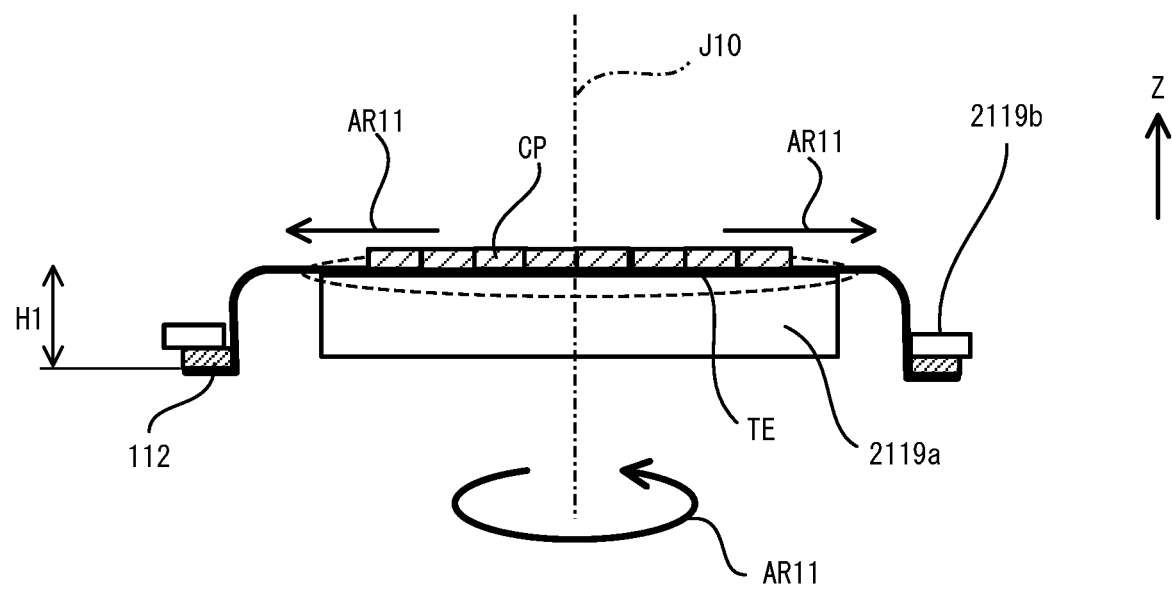
FIG. 14C is a schematic view illustrating a situation in which the frame supporter and the inner supporter are rotated in the supporters of the cleaning device according to Alternative Example.

The cleaning device cleans the chips CP by rotating the inner supporter 2119a and the frame supporter 2119b while discharging water or a cleaning liquid from the cleaning head as illustrated in FIG. 14C. Then, the rotary driver dries the sheet TE and the plurality of chips CP by rotating the inner supporter 2119a and the frame supporter 2119b in the state of stopping the discharge of the water or the cleaning liquid from the cleaning head. In such a case, the water or the cleaning liquid adhering to the chips CP is removed by centrifugal force, as illustrated in the arrow AR11 in FIG. 14C.

In accordance with the present configuration, the first site PA1, in which the plurality of chips CP is stuck, in the sheet TE, and the second site PA2 fixed to the holding frame 112 are placed in the state of being spaced from each other so that the first site PA1 is closer to the direction of the rotation axis J10 than the second site PA2 by a distance H1, whereby the water or the cleaning liquid adhering to the chips CP is inhibited from staying without coming into contact with the sheet TE and the inner side of the holding frame 112 when the inner supporter 2119a and the frame supporter 2119b are rotated.

The chip bonding system may include a cleaning device (not illustrated) that separately cleans chips CP On a one-by-one basis. In such a case, the cleaning device may supply one chip CP from the chip supply device, and may clean the chip CP in transportation of the one chip CP to the bonding device.

Moreover, it is preferable to adopt a stealth dicing method using laser light, as the method of dicing the substrate to be diced, which is the base material of the plurality of chips CP, from the viewpoint of suppressing generation of burrs on ends of the chips CP. As a result, the plurality of chips CP stuck to the sheet TE in the state of coming into contact with each other or in the state of being connected to each other can be handled similarly to one substrate to be diced prior to dicing.

Figure 15A:
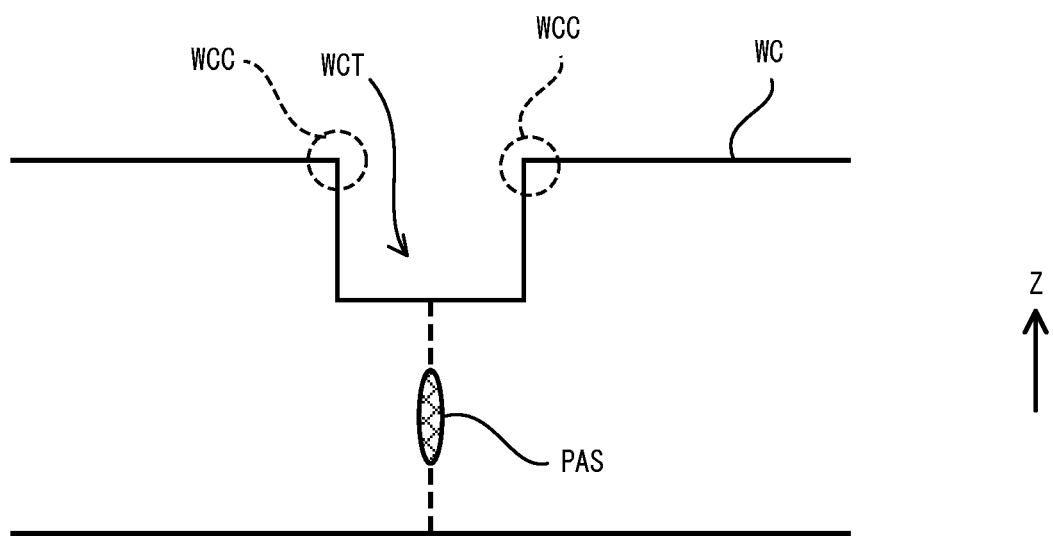
FIG. 15A is a schematic view of a substrate to be diced according to Alternative Example.
Figure 15B:
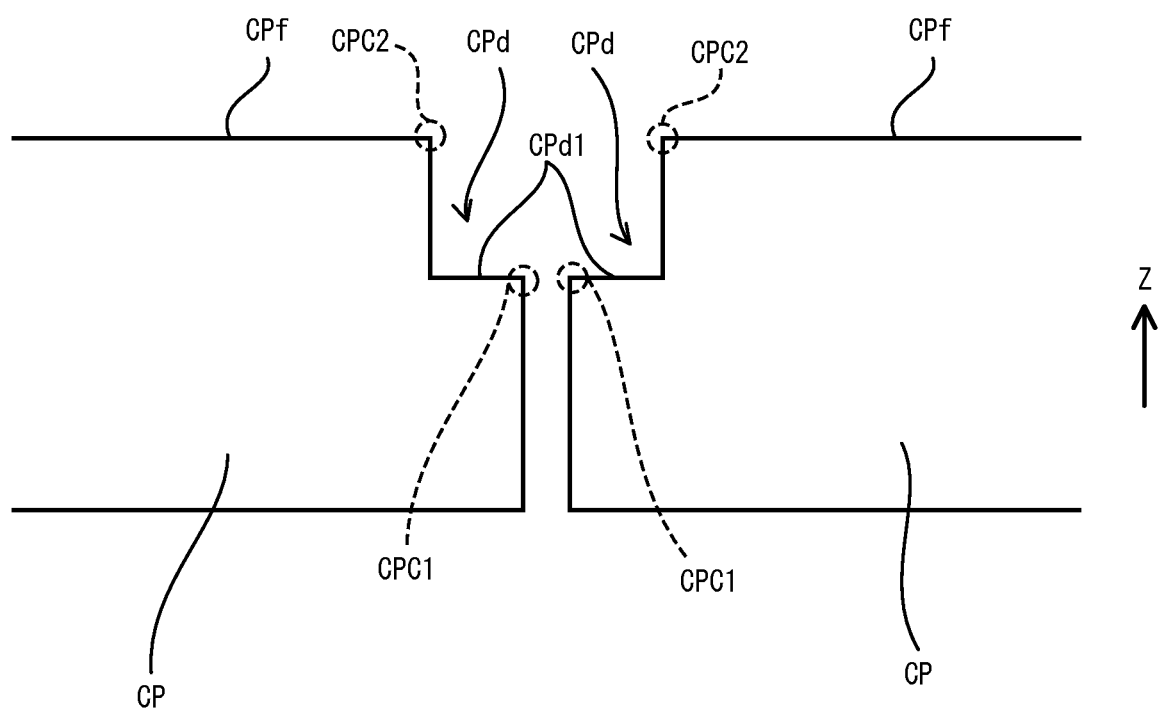
FIG. 15B is a schematic view of a chip CP according to Alternative Example.

Further, a portion corresponding to a portion PAS subjected to stealth dicing in a substrate WC to be diced may be processed to form a groove WCT in the portion using s dicing device, for example, as illustrated in FIG. 15A. In such a case, burrs may be generated on corner portions WCC surrounded by the dashed lines in FIG. 15A. Thus, the burrs generated on the corner portions WCC are removed by polishing the groove WCT after the formation of the groove WCT. Then, the substrate WC to be diced is divided into a plurality of chips CP including uneven portions CPd, as illustrated in FIG. 15B. The chips CP include the uneven portions CPd as described above, whereby first corners CPC1 or surfaces Cpd1 of the uneven portions CPd in the −Z-direction are enabled to be held to transport the chips CP. Accordingly, the chips CP can be transported without touching the bonding surfaces CPf and second corner portions CPC2 of the chips CP.

The chip bonding system according to Alternative Example described above may further include a separation device (not illustrated) that executes a separation step of allowing a plurality of chips CP to be in the state of being spaced from each other by expanding a sheet TE held by a holding frame 112 that holds the sheet TE to which the plurality of chips CP is stuck. In the separation device, it is also acceptable to re-hold a ring-shaped sheet holding frame (not illustrated) in the state of expanding the sheet TE, and to supply the sheet holding frame that holds the sheet TE to a bonding device.

For example, in a case in which a plurality of kinds of chips CP is intended to be mounted on one substrate WT, it is necessary to loosen a sheet TE in the state of being expanded, and to take the sheet TE out of a chip supply device when a chip CP put into the chip supply device is changed. Therefore, when the sheet TE in the state of being expanded is loosened, chips CP, adjacent to each other, stuck to the sheet TE may collide with each other and be damaged, whereby burrs or particles may be generated.

In contrast, in accordance with the present configuration, the plurality of chips CP stuck to the sheet TE can be maintained in the state of being spaced from each other. As a result, the plurality of kinds of chips CP can be stored in the state of being stuck to the sheet TE. Accordingly, for example, in a case in which a plurality of kinds of chips CP is intended to be mounted on one substrate WT, it is possible to mount the chips CP on the substrate WT while exchanging a sheet holding frame that holds a sheet TE as appropriate, and burrs or particles the chips CP are inhibited from being generated.

Figure 16A:
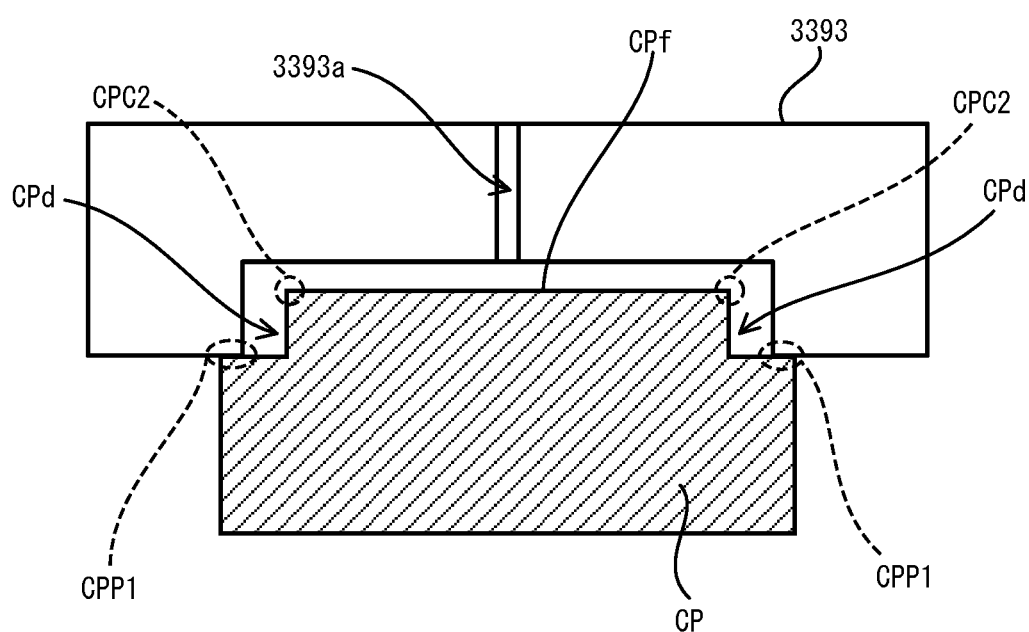
FIG. 16A is a schematic cross-sectional view of a chip holder according to Alternative Example.
Figure 16B:
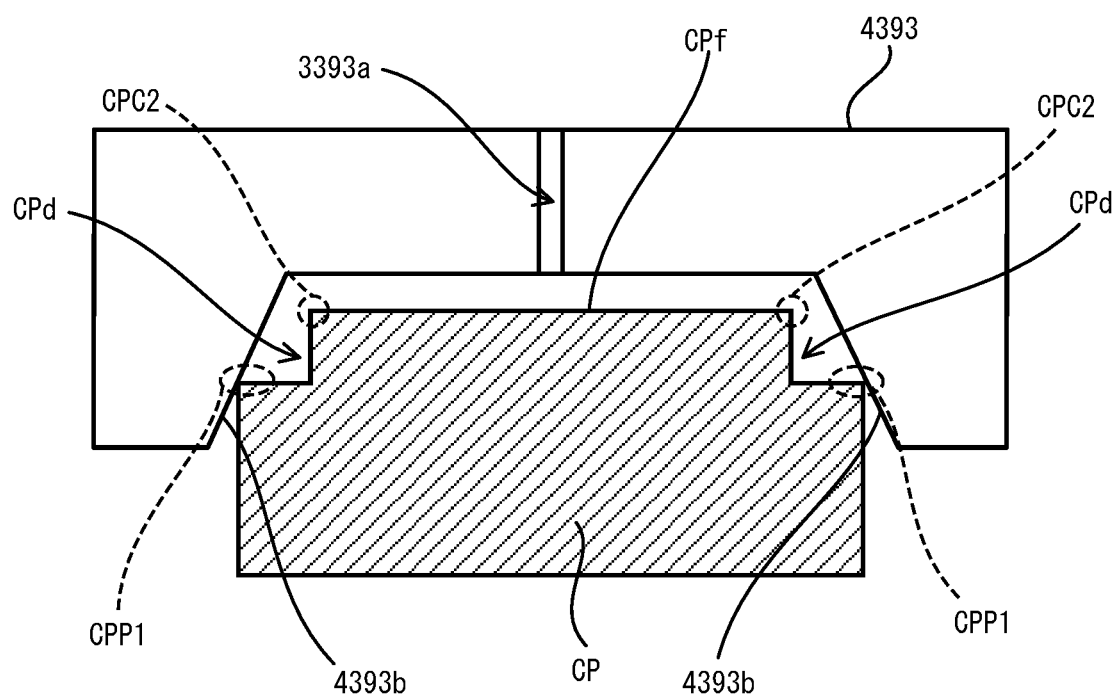
FIG. 16B is a schematic cross-sectional view of the chip holder according to Alternative Example.

In the embodiment, a chip CP may include uneven portions CPd on a circumference closer to a bonding surface CPf, for example, as illustrated in FIG. 16A. In such a case, the chip transportation device 39 may include a chip holder 3393 in which an aspirator 3393a is disposed, as illustrated in FIG. 16A, on a leading end of the arm 394 described above. The chip holder 3393 is a collet chuck that holds the chip CP by aspirating the chip CP by an aspirator 3393a in a state in which a part thereof abuts on portions opposite to the bonding surface CPf in the uneven portions CPd of the chip CP, that is, on corners CPP1. "Portions opposite to bonding surface CPf in uneven portions CPd of chip CP" include not only the corners CPP1 but also the uneven portions CPd or a side of the outermost periphery of the chip CP. In other words, the chip holder 3393 holds the portions opposite to the bonding surface CPf in the uneven portions CPd of the chip CP, that is, the corners CPP1. The chip transportation device 39 executes a chip transportation step (step of transporting a second article to be bonded), in which the portions CPP1 opposite to the bonding surface CPf in the uneven portions CPd of the chip CP are held by the chip holder 3393, to transport the chip CP from the chip supply device 10 to the bonding device 30. As illustrated in FIG. 16B, a chip holder 4393 may be a collet chuck including sloped surfaces 4393b. In FIG. 16B, configurations similar to the configurations illustrated in FIG. 16A are denoted by the same reference characters. In such a case, when a chip CP is held by the chip holder 4393, the chip CP is held in a state in which the first corners CPC1 of the chip CP come into contact with the sloped surfaces 4393b, and therefore, the position of the chip CP is corrected. As a result, contact of the chip holder 4393 with the bonding surface CPf or second corners CPC2 of the chip CP is preferably precluded due to the positional deviation of the chip CP when the chip CP is held by the chip holder 4393. A configuration is also acceptable in which the chip holder clamps and transports the second corners CPC2 or the outermost side of the chip CP. Further, the chip holder may include a so-called tool with an uneven portion that can aspirate and hold the chip CP in the state of coming into contact with the uneven portions CPd of the chip CP and of coming into contact with neither the second corners CPC2 nor bonding surface CPf of the chip CP.

Prior to the bonding step of bonding the chips CP to the substrate WT, the chips CP are transported to the head 33 on a one-by-one basis, and bonded, in the chip bonding system described in the embodiment. In such a case, when a chip holder (not illustrated) that holds the chips CP from a side closer to the bonding surfaces CPf is disposed on the leading end of the above-mentioned arm 394, contact of the chip holder with the bonding surfaces CPf of the chips CP or the corners of the chips CP may result in generation of particles or burrs, and may result in generation of voids in the interface between both of the chips CP and the substrate WT in the case of bonding the chips CP to the substrate WT. Contact of the chip holder with the bonding surfaces CPf of the chips CP, subjected to activation treatment, may also result in the deterioration of the state of the bonding surfaces CPf, whereby poor bonding between the chips CP and the substrate WT may occur. For example, in a method in which chips CP are bonded to a substrate WT by melting solder disposed on the chips CP, particles adhering to bonding surfaces CPf of the chips CP are taken in the solder, and therefore, the state of the bonding between the chips CP and the substrate WT is not greatly influenced. However, in a method in which bonding surfaces CPf of chips CP are subjected to activation treatment, followed by bonding the chips CP to the substrate WT, particles adhering to the bonding surfaces CPf of the chips CP or burrs generated on the corners of the chips CP may greatly influence the state of the bonding between the chips CP and the substrate WT because of the bonding between a mounting surface WTf and the bonding surfaces CPf in a solid-phase state. In contrast, in accordance with the present configuration, the uneven portions CPd are disposed in the circumference closer to the bonding surface CPf of the chip CP, the chip CP can be therefore transported without touching the bonding surface CPf of the chip CP, it is therefore possible to inhibit particles or burrs from being generated on the bonding surface CPf and corners of the chip CP and to maintain the bonding surface CPf in a favorable state, and therefore, occurrence of poor bonding between the chip CP and the substrate WT is suppressed.

Further, the present configuration is not limited to a case in which the method of the activation treatment of the bonding surfaces CPf of the chips CP is the method in which the irradiation with the particle beam described above is performed, but is effective even in a case in which the activation treatment method is, for example, a method in which the bonding surfaces CPf are activated by performing plasma treatment of the bonding surfaces CPf of the chips CP. In the bonding method in which the chips CP and the substrate WT are bonded to each other by performing the activation treatment of the bonding surfaces CPf of the chips CP, contact of the chip holder with the bonding surfaces CPf subjected to the activation treatment results in occurrence of poor bonding between the chips CP and the substrate WT, and therefore, the transportation without touching the bonding surfaces CPf of the chips CP as described above is particularly important for favorably bonding the chips CP and the substrate WT to each other.

In the embodiment, the example in which the cleaning step of performing the activation treatment of the bonding surfaces CPf of the chips CP and of then cleaning the bonding surfaces CPf of the chips CP in the transportation of the chips CP to the bonding device 30 has been described. Without limitation thereto, however, it is also acceptable to perform activation treatment of a bonding surface CPf of a chip CP, and and to then clean the bonding surface CPf of the chip CP before transporting the chip CP to a bonding device 30. In such a case, particles adhering to the bonding surface CPf of the chip CP can be preferably removed before the transportation to the bonding device 30.

Figure 17A:
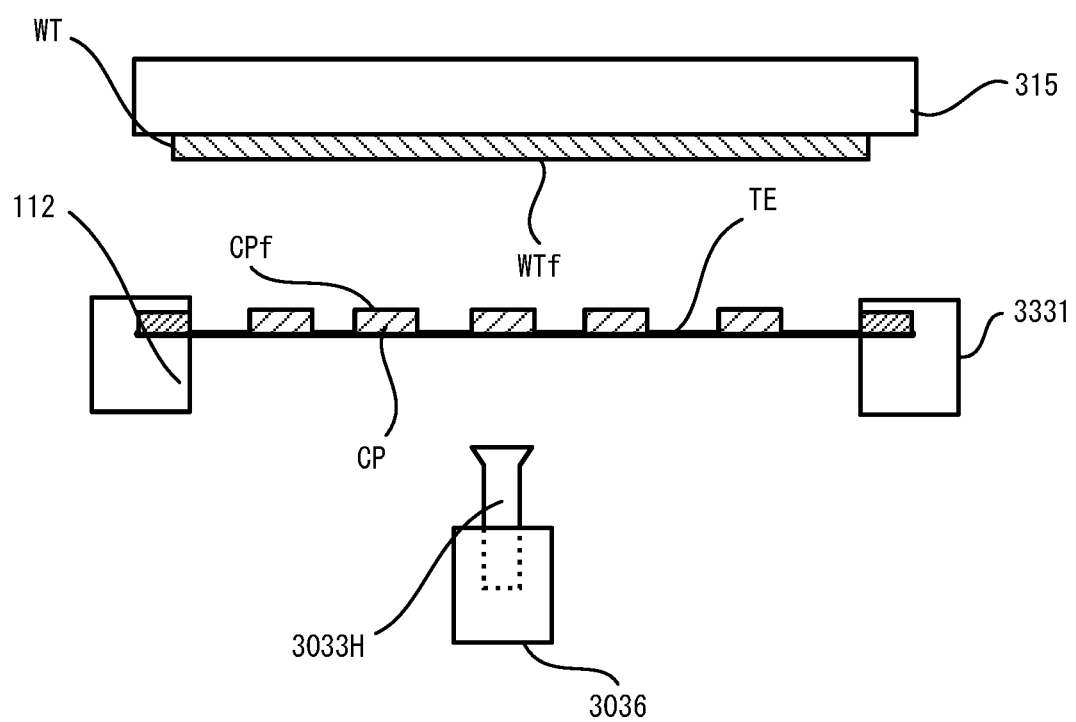
FIG. 17A is a schematic view illustrating a part of a bonding device according to Alternative Example.

In the embodiment, the example has been described in which the chips CP are transported to the head 33H of the bonding device 30 on a one-by-one basis to bond the chips CP to the substrate WT. Without limitation thereto, however, for example, it is also acceptable to perform the above-mentioned separation step, followed by transporting a chip CP, in the state of being stuck to a sheet TE, to a bonding device 30 to directly bond the chip CP to the substrate WT. For example, as illustrated in FIG. 17A, a bonding device may include a stage 315 which is a substrate supporter that holds a substrate WT; a frame supporter 3331 that supports a holding frame 112 that holds a sheet TE to which a plurality of chips CP is stuck; a head 3033H that presses the chips CP from a side opposite to the chips CP in the sheet TE toward the stage 315; a head driver 3036 that drives the head 3033H; and an elevator mechanism (not illustrated) that moves up and down the frame supporter 3331 and the head driver 3036. In FIG. 17A, configurations similar to those in the embodiment are denoted by the same reference characters as those in FIG. 2.

Moreover, a bonding device includes: a supporter driver (not illustrated) that drives a stage 315 and a frame supporter 3331; an imaging device (not illustrated) that images a first alignment mark and a second alignment mark from at least one of a side opposite to a substrate WT in a chip CP and a side opposite to the chip CP in the substrate WT; and a controller (not illustrated) that controls the supporter driver and the imaging device. Moreover, the first alignment mark (not illustrated) is disposed on the substrate WT, and the second alignment mark (not illustrated) is disposed on the chip CP. In such a case, the controller controls the imaging device to image the first alignment mark and the second alignment mark, and calculates the amount of the positional deviation of the chip CP from the substrate WT on the basis of an imaged photographed image. Then, the controller controls the supporter driver to relatively move the frame supporter 3331 or the stage 315 in a direction in which the amount of the positional deviation of the chip CP from the substrate WT is reduced. In other words, the chip bonding system executes: an imaging step of imaging the first alignment mark and the second alignment mark from at least one of the side opposite to the chip CP in the substrate WT and the side opposite to the substrate WT in the chip CP by the imaging device; a step of calculating the amount of positional deviation, in which the amount of the positional deviation of the chip CP from the substrate WT is calculated on the basis of a photographed image imaged in the imaging step; and a movement step of moving the frame supporter 3331 or the stage 315 in a direction in which the amount of the positional deviation of the chip CP from the substrate WT is reduced. The imaging device, which is a so-called two-visual-field camera, may have a configuration in which the alignment mark disposed in each of the chip CP and the substrate WT is imaged, in the state of being inserted between the chip CP and the substrate WT. Alternatively, the imaging device, which is a so-called camera using infrared rays, may image the alignment marks, using infrared light, from a side opposite to a mounting surface WTf in the substrate WT or a side opposite to a bonding surface CPf in the chip CP. When the imaging device is a two-visual-field camera, particles are incorporated into between the chip CP and the substrate WT. In contrast, a case in which the imaging device has the configuration in which the alignment marks are imaged using infrared light is preferred because it is not necessary to place the imaging device between the chip CP and the substrate WT, and therefore, particles can be inhibited from being incorporated into between the chip CP and the substrate WT to inhibit the particles from adhering to the chip CP or the substrate WT.

The bonding device may image the alignment marks while moving one imaging device, or may image two sets, of which one set of the alignment marks includes the alignment mark disposed on the substrate WT or the alignment mark disposed on the chip CP, by two imaging devices, to calculate the positional deviation of the chip CP and the deviation of the posture of the chip CP in a rotation direction. When the chip CP is pushed up by the head 3033H, the bonding device preferably suck a chip CP adjacent to the pushed-up chip CP from a side opposite to the chips CP in the sheet TE so that the chip CP adjacent to the pushed-up chip CP is prevented from following the pushed-up chip CP and from being pushed up. When the sheet TE is expanded to separate the chips CP, followed by shrinking the sheet TE again, the chips CP adjacent to each other come into contact with each other, whereby particles are generated from the chips CP, and burrs are generated on the corners of the chips CP. Accordingly, it is preferable to bond the chip CP to the substrate WT in the state of expanding the sheet TE after the separation step described above. It is preferable to bring the chip CP into contact with the substrate WT from the central portion of the chip CP by pressing the central portion of the chip CP toward the substrate WT when the chip CP is bonded to the substrate WT. As a result, the bonding from the central portion of the chip CP to the substrate WT proceeds, and therefore, generation of voids caused by inclusion of air into between the chip CP and the substrate WT is avoided.

In such a case, the frame supporter 3331, the head 3033H, and the head driver 3036 are placed vertically below the stage 315.

Figure 17B:
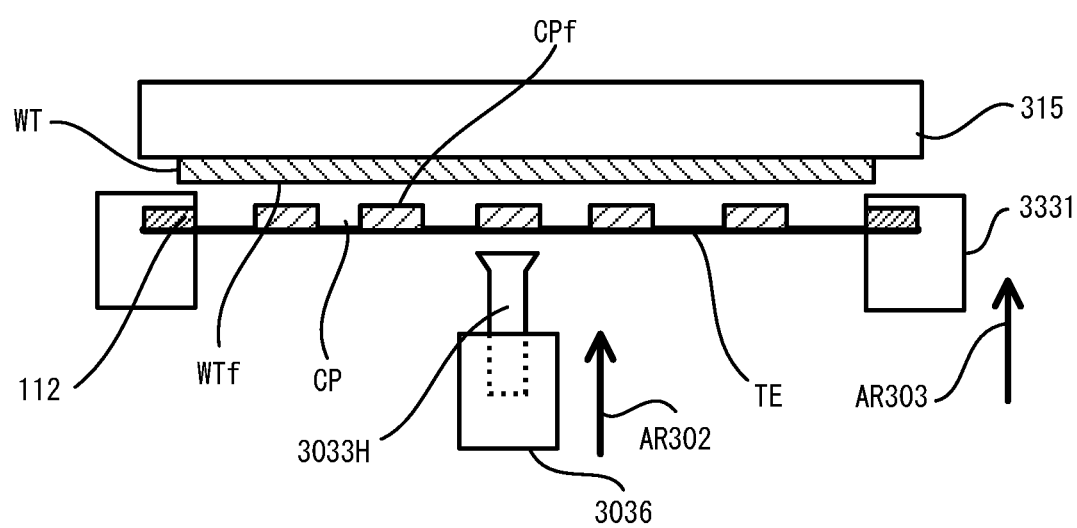
FIG. 17B is a schematic view illustrating a part of the bonding device according to Alternative Example.
Figure 17C:
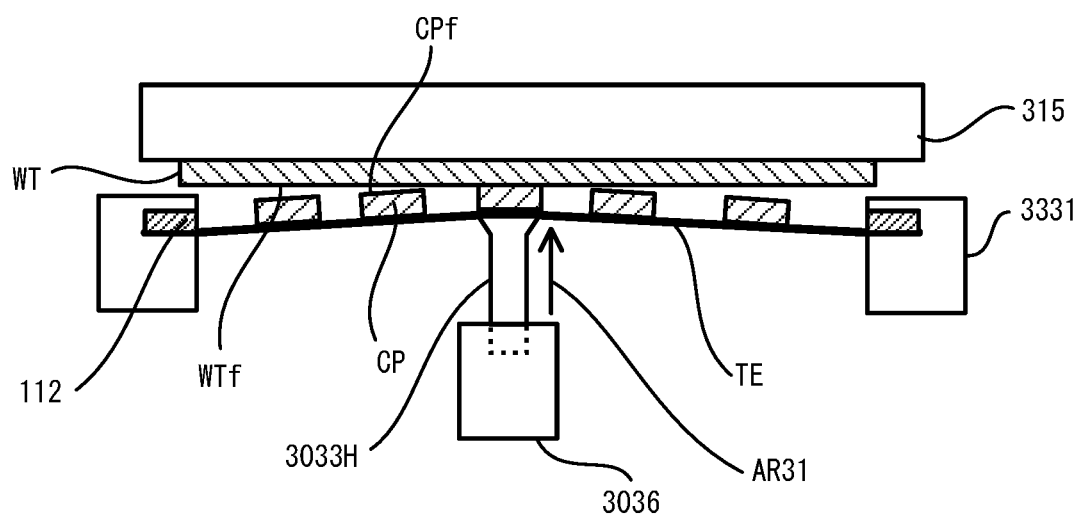
FIG. 17C is a schematic view illustrating a part of the bonding device according to Alternative Example.

In this bonding device, first, the holding frame 112 is placed in a posture in which a surface closer to the chips CP in the sheet TE faces vertically upward, as illustrated in FIG. 17A. Subsequently, the elevator mechanism lifts the frame supporter 3331 and the head driver 3036 to bring the frame supporter 3331 and the head driver 3036 closer to the stage 315 as indicated by the arrows AR302 and AR303 in FIG. 17B, so that a distance between the sheet TE and the mounting surface WTf of the substrate WT becomes a preset reference distance. In this state, the head driver 3036 drives the head 3033H in the direction of approaching the stage 315 as illustrated in FIG. 17C, to thereby bond the chip CP to the substrate WT. In other words, the bonding device bonds the chip CP to the substrate WT by moving the head 3033H in the direction of approaching the substrate WT in the state of allowing the head 3033H to abut on the side opposite to the plurality of chips CP in the sheet TE to which the plurality of chips CP is stuck.

The sheet TE, to which an adhesive material, in which irradiation of a side, to which a plurality of chips CP is stuck, in the sheet TE, with ultraviolet rays results in a decrease in adhesive strength, is applied, may be adopted. In such a case, the bonding device may include an ultraviolet ray irradiator that is capable of locally irradiating only a portion corresponding to a chip CP coming into contact with the substrate WT in the sheet TE, with ultraviolet rays. In such a case, it is preferable that the bonding device includes the head 3033H formed of a transparent material, allows the head 3033H to abut on the side opposite to the chips CP in the sheet TE, moves the head 3033H in the direction of approaching the substrate WT, and allows the ultraviolet ray irradiator to irradiate the sheet TE with ultraviolet rays through the head 3033H in a state in which the chip CP is brought into contact with the substrate WT. The sheet TE is not limited to a sheet to which the adhesive material in which irradiation with ultraviolet rays results in a decrease in adhesive strength is applied, but may be a sheet to which an adhesive material, in which, for example, heating or another process results in a decrease in adhesive strength, is applied.

In accordance with the present configuration, a step, in which the chip CP is picked up from the sheet TE and transferred to the head 33H, as in the surface mounting system 1 according to the embodiment, is eliminated, and therefore, the number of steps required for mounting the chip CP on the substrate WT can be reduced. In accordance with the present configuration, a step in which the chips CP are transported on a one-by-one basis can be omitted, and therefore, the deterioration of the bonding surfaces CPf or the generation of particles, caused by contact of the chip holder with the bonding surfaces CPf of the chips CP in the case of transporting the chips CP on a one-by-one basis, or the generation of burrs, caused by contact of the chip holder with the corners of the chips CP, can be suppressed to suppress poor bonding between the chips CP and the substrate WT.

A bonding step may be performed in which the bonding surfaces CPf of the chips CP are subjected to activation treatment, followed by bonding the chips CP to the substrate WT on an as-is basis. Alternatively, a cleaning step of cleaning the bonding surfaces CPf of the chips CP may be performed before the bonding step in which the bonding surfaces CPf of the chips CP are subjected to the activation treatment, followed by bonding the chips CP to the substrate WT. Such a case is preferred because particles adhering to the bonding surfaces CPf of the chips CP can be removed before the chips CP are bonded to the substrate WT.

Particles generated from a plurality of chips CP when a sheet TE is expanded to result in separation into the chips CP are often put on the sheet TE. Therefore, for example, in a case in which the chips CP are intended to be bonded from vertically above a substrate WT, the particles put on the sheet TE may fall on the substrate WT, whereby poor bonding between the chips CP and the substrate WT may occur. In contrast, in accordance with the present configuration, the chip CP is brought closer to the substrate WT from vertically downward, and subjected to bonding, and therefore, occurrence of poor bonding between the chip CP and the substrate WT, caused by particles put on the sheet TE, is suppressed.

Moreover, the present configuration is preferable for so-called hybrid bonding, in which a flat bonding surface CPf obtained by CMP-polishing, for example, a Cu electrode and an insulator film is activated by plasma treatment or particle beam irradiation, and water molecules are then allowed to adhere to the bonding surface CPf, which is hydrophilized, followed by bonding the chip CP to the substrate WT.

In the embodiment, the example of the chip bonding system including the cleaning device 85 has been described. Without limitation thereto, however, the cleaning device 85 need not be included.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

This application claims the benefit of Japanese Patent Application No. 2018-162738, filed on Aug. 31, 2018, and Japanese Patent Application No. 2018-205227, filed on Oct. 31, 2018, of which the entirety of the disclosures is incorporated by reference herein.

INDUSTRIAL APPLICABILITY

The present disclosure is preferable for manufacturing, for example, a CMOS image sensor, a memory, a computing element, and MEMS.

REFERENCE SIGNS LIST

1 Chip bonding system
10 Chip supply device
11 Chip supply

30 Bonding device
31 Stage unit
33 Bonder
33H, 3033H Head
36, 3036 Head driver
39 Chip transportation device
60 Activation treatment device
61 Particle beam source
62 Supporter
63 Beam source transporter
64 Chamber
64a Hole
70 Transportation device
71 Transportation robot
80 Export and import unit
85 Cleaning device
90 Controller
111 Pick-up mechanism
111a Needle
112 Holding frame
113 Holding frame driver
114, 622 Cover
114a Through-hole
119, 621 Frame holder
315 Stage
320, 853 Stage driver
391 Plate
392 Plate driver
393 Chip holder
394 Arm
395 Arm driver
411 Chip tool
411a, 411b Through-hole
413 Head body
432a Chip supporter
432b Supporter driver
611 Electrode
612 Discharge chamber
612a FAB radiation aperture
613 Beam source driver
614, 677 Gas supply
623 Frame holder driver
631 Support rod
632 Support
633 Support driver
634 Bellows
672 Magnetron
673 Waveguide
674 Glass window
675 Plasma chamber
676 Supply pipe
851 Cleaning head
852 Stage
2119a Inner supporter
2119b Frame supporter
CP Chip
CPA1, CPA9 Impurity
CPf Bonding surface
TE Sheet
OB1 Locus
PLM9 Sheath region
WT Substrate
WTf Mounting surface

The invention claimed is:

1. A bonding system that is a bonding system for bonding a second article to a first article, the bonding system comprising:

an activation treatment device that comprises a particle beam source that activates a bonding surface of the second article by irradiating a bonding surface of the second article with a particle beam, and a radical source that activates the bonding surface of the second article by irradiating the bonding surface of the second article with a radical, the activation treatment of the bonding surface of the second article irradiated with the radical from the radical source following the activation treatment of the bonding surface of the second article irradiated with the particle beam from the particle beam source; and a bond device that brings the second article, of which the bonding surface is activated by the activation treatment device, into contact with the first article, to thereby bond the second article to the first article, wherein the activation treatment device places the second article in a posture in which the bonding surface of the second article faces vertically downward, and irradiates the bonding surface of the second article with the particle beam from the particle beam source positioned vertically below the second article, and following the irradiation, the activation treatment device reverses the second article to a posture in which the bonding surface of the second article faces vertically upward, and then irradiates the bonding surface of the second article with the radical from the radical source positioned vertically above the second article.

2. The bonding system according to claim 1, wherein the particle beam comprises nitrogen.

3. The bonding system according to claim 1, wherein
the activation treatment device further comprises an object supporter that supports an object having a sheet which is formed of a resin and to which at least one of the second articles is stuck,
the particle beam source activates the bonding surface of the second article by irradiating, from vertically below the object, a portion of the object including the bonding surface of the second article and the sheet, in a state where the object supporter holds the object in a posture in which the bonding surface of the second article faces vertically downward, and
the radical source activates the bonding surface of the second article by irradiating, from vertically above the object, a portion of the object including the bonding surface of the second article and the sheet, in a state where the object supporter holds the object in a posture in which the bonding surface of the second article faces vertically upward.

4. The bonding system according to claim 3, wherein
the first article is a substrate,
the second article is a chip, and
the object supporter comprises:
 a holding frame that holds a sheet which is formed of a resin, and to which the second article is stuck; and
 a supporter that supports the holding frame in a posture in which one side to which the second article is stuck in the sheet faces the particle beam source.

5. The bonding system according to claim 4, wherein the particle beam source is set so that an incidence angle of the particle beam with respect to a virtual surface comprising the bonding surface of the second article is 30 degrees or more and 80 degrees or less.

6. The bonding system according to claim 4, wherein
a plurality of the second articles are stuck at an equal spacing, and an incidence angle of the particle beam with respect to a virtual surface comprising bonding surfaces of the plurality of second articles is set so that a relational equation of the following equation (1) is established when the incidence angle is set at θ1, a spacing between the plurality of second articles adjacent to each other is set at L1, and the thickness of the second article is set at T1

[Equation 1]

$$\theta 1 = \tan^{-1}\left(\frac{L1}{T1}\right).\qquad\text{Equation (1)}$$

7. The bonding system according to claim 4, wherein the activation treatment device further comprises a cover that covers a portion excluding a portion to which the second article is stuck in one side, to which the second article is stuck, of the sheet in a state in which the holding frame is supported by the supporter.

8. The bonding system according to claim 1, wherein the activation treatment device activates the bonding surfaces of a plurality of the second articles, just after dicing a substrate to be diced, which is a base material of the second article, and in a state of coming into contact with each other or in a state of being connected to each other.

9. The bonding system according to claim 4, the bonding system further comprising a cleaning device that cleans the second article.

10. The bonding system according to claim 9, wherein the cleaning device cleans the second article in a state in which a sheet to which the second article is stuck is held by the holding frame.

11. The bonding system according to claim 10, wherein the second article, of which the number is plural, exists, a plurality of the second articles are produced by dicing a substrate to be diced, which is a base material of the plurality of second articles, the cleaning device cleans the plurality of second articles just after dicing the substrate to be diced, and in a state of coming into contact with each other or in a state of being connected to each other, and the bonding system further comprises a separation device that allows the plurality of second articles to be in a state of being spaced from each other by extending the sheet held by the holding frame that holds the sheet to which the plurality of second articles are stuck.

12. The bonding system according to claim 10, wherein the second article, of which the number is plural, exists, the cleaning device comprises:
   an inner supporter that supports an interior of the holding frame in the sheet held by the holding frame;
   a frame supporter that supports the holding frame, and that is movable to the inner supporter;
   a frame driver that drives the frame supporter; and
   a rotary driver that rotates the inner supporter and the frame supporter about a rotation axis along the thickness direction of the holding frame;
   the frame driver moves the frame supporter relatively with respect to the inner supporter, whereby a first site, to which a plurality of the second articles are stuck, in the sheet, and a second site fixed to the holding frame are allowed to be in a state of being spaced from each other so that the first site is closer to a direction of an axis of rotation of the sheet than the second site; and
   the rotary driver rotates the inner supporter and the frame supporter in a state in which the first site, to which the plurality of second articles are stuck, in the sheet, and a second site fixed to the holding frame are spaced from each other so that the first site is closer to a direction of an axis of rotation of the sheet than the second site, whereby the sheet and the plurality of second articles are cleaned.

13. The bonding system according to claim 12, wherein the cleaning device further comprises a sucker that sucks the first site, to which the plurality of second articles are stuck, in the sheet just after dicing the substrate to be diced, and in a state of coming into contact with each other or in a state of being connected to each other, from a side opposite to the plurality of second articles in the sheet, and
   the frame driver moves the frame supporter relatively with respect to the inner supporter in a state in which the first site in the sheet is sucked by the sucker, whereby the first site, to which the plurality of second articles are stuck, in the sheet, and a second site fixed to the holding frame are allowed to be in a state of being spaced from each other so that the first site is closer to a direction of an axis of rotation of the sheet than the second site.

14. The bonding system according to claim 1, wherein plural kinds of regions with different materials are formed on the bonding surface of the second article.

15. The bonding system according to claim 14, wherein an electrode and an insulator film are disposed on the bonding surface of the second article, and
   the insulator film is formed of an oxide, an oxynitride, or a nitride.

16. The bonding system according to claim 1, wherein the activation treatment device moves at least one of the particle beam source and the objects relatively with respect to another of the particle beam source and the objects.

17. The bonding system according to claim 1, wherein the particle beam source is a fast atom beam source.

18. The bonding system according to claim 1, wherein the bond device causes hydrophilic bonding of the second article to the first article.

19. The bonding system according to claim 1, wherein the second article, of which the number is plural, exists, and
   the bond device comprises:
      a substrate supporter that holds the first article;
      a frame supporter that supports a holding frame that holds a sheet to which a plurality of the second articles are stuck;
      a head that abuts on a side opposite to the plurality of second articles in the sheet; and
      a head driver that drives the head in a direction of approaching the substrate supporter, to thereby bond each of the second article to the first article.

\* \* \* \* \*